United States Patent
Casey

(10) Patent No.: US 10,062,826 B2
(45) Date of Patent: Aug. 28, 2018

(54) THERMOELECTRIC DEVICE

(71) Applicant: Vecarius, Inc., Somerville, MA (US)

(72) Inventor: Steven Casey, Boston, MA (US)

(73) Assignee: Vecarius, Inc., Somerville, MA (US)

( * ) Notice: Subject to any disclaimer, the term of this patent is extended or adjusted under 35 U.S.C. 154(b) by 277 days.

(21) Appl. No.: 14/776,560

(22) PCT Filed: Mar. 15, 2014

(86) PCT No.: PCT/US2014/030031
§ 371 (c)(1),
(2) Date: Sep. 14, 2015

(87) PCT Pub. No.: WO2014/145293
PCT Pub. Date: Sep. 18, 2014

(65) Prior Publication Data
US 2016/0035957 A1    Feb. 4, 2016

Related U.S. Application Data

(60) Provisional application No. 61/801,105, filed on Mar. 15, 2013.

(51) Int. Cl.
*H01L 35/32* (2006.01)
*F01N 5/02* (2006.01)
*H01L 35/30* (2006.01)

(52) U.S. Cl.
CPC .............. *H01L 35/32* (2013.01); *F01N 5/025* (2013.01); *H01L 35/30* (2013.01); *Y02T 10/16* (2013.01)

(58) Field of Classification Search
CPC ......... H01L 35/30; H01L 35/32; F01N 5/025; Y02T 10/16
See application file for complete search history.

(56) References Cited

U.S. PATENT DOCUMENTS 3,617,390 A * 11/1971 De Bucs ............... H01L 35/06
136/204
3,781,176 A   12/1973 Penn et al.
(Continued)

FOREIGN PATENT DOCUMENTS

CN       102220948 A    10/2011
DE    102011005246 A1     9/2012
(Continued)

OTHER PUBLICATIONS

International Search Report and Written Opinion dated Nov. 5, 2014 in corresponding PCT application No. PCT/US2014/030031.
(Continued)

*Primary Examiner* — Matthew T Martin
(74) *Attorney, Agent, or Firm* — Nields, Lemack & Frame, LLC

(57) ABSTRACT

The present disclosure relates to thermoelectric devices useful for a range of thermoelectric applications (e.g., high temperature thermoelectric generation, fluid conditioning). Thermoelectric devices may include one or more heat exchangers (e.g., coolant heat exchanger(s)) and one or more thermoelectric layers adjacent to the heat exchanger(s). An enclosure may surround the thermoelectric layer(s) and heat exchanger(s), providing a barrier from outside fluid (e.g., hot fluid flow). The enclosure may conduct heat between the outside surroundings and the thermoelectric layer(s). The heat exchanger(s) may be spaced from and movable or slidable relative to the enclosure, which may accommodate for certain thermal expansion effects. The enclosure may include a conformable surface adapted to conform substantially to the shape of the thermoelectric layer(s) (e.g., when a vacuum is applied). One or more thermally conductive members (e.g., fins) may extend from the conformable (Continued)

enclosure. Various embodiments of a thermal switch are also described.

19 Claims, 22 Drawing Sheets

(56) References Cited

U.S. PATENT DOCUMENTS

| | | | |
|---|---|---|---|
| 4,753,682 A | 6/1988 | Cantoni | |
| 6,347,521 B1 | 2/2002 | Kadotani et al. | |
| 8,100,216 B2 | 1/2012 | Bartilson | |
| 8,596,050 B2 | 12/2013 | Gerlach et al. | |
| 8,613,191 B2 | 12/2013 | Oesterle et al. | |
| 2006/0005873 A1 | 1/2006 | Kambe et al. | |
| 2006/0191271 A1 | 8/2006 | Takahashi et al. | |
| 2007/0045044 A1* | 3/2007 | Sullivan | F01N 1/02 181/268 |
| 2010/0229911 A1 | 9/2010 | Leavitt et al. | |
| 2011/0067742 A1 | 3/2011 | Bell et al. | |
| 2011/0247670 A1* | 10/2011 | Ohmura | H01L 35/32 136/212 |
| 2011/0252774 A1* | 10/2011 | Spieth | F01N 5/025 60/320 |
| 2011/0265838 A1 | 11/2011 | Kambe | |
| 2012/0012146 A1 | 1/2012 | Salzgeber | |
| 2012/0297755 A1 | 11/2012 | Adldinger et al. | |
| 2013/0104953 A1* | 5/2013 | Poliquin | H01L 35/30 136/224 |
| 2013/0152989 A1 | 6/2013 | Krinn et al. | |
| 2013/0186448 A1 | 7/2013 | Ranalli et al. | |
| 2013/0283764 A1 | 10/2013 | Schmidt et al. | |
| 2014/0033703 A1 | 2/2014 | Limbeck et al. | |
| 2014/0034102 A1 | 2/2014 | Ranalli et al. | |
| 2014/0060605 A1 | 3/2014 | Angermann et al. | |

FOREIGN PATENT DOCUMENTS

| | | |
|---|---|---|
| JP | 2000-214934 A | 8/2000 |
| JP | 2006-49872 A | 2/2006 |
| JP | 2006-234362 A | 9/2006 |
| WO | 2012/139992 A2 | 10/2012 |
| WO | 2012/170443 A2 | 12/2012 |

OTHER PUBLICATIONS

"GMZ Energy successfully demonstrates 1 kW thermoelectric generator for Bradley Fighting Vehicle", Dec. 3, 2014, http://www.greencarcongress.com/2014/12/20141203-gniz.htrnl, accessed online Nov. 5, 2015.

"GMZ Energy announces new, high-power thermoelectric module: TG16-1.0", Oct. 1, 2014, http://www.greencarcongress.com/2014/10/20141001-gmz.html, accessed online Nov. 5, 2015.

"GMZ Energy prepares to launch a boiler that keeps homes warm during power outages", Nov. 12, 2014, http://www.bizjournals.com/boston/blog/techflash/2014/11/gmz-energy-prepares-to-launch-a-boiler-that-keeps.html, accessed online Nov. 5, 2015.

Chinese communication, with English translation, dated May 27, 2017 in corresponding Chinese patent application No. 201480027916.4.

Japanese communication, with English translation, dated Oct. 3, 2017 in corresponding Japanese patent application No. 2016-503311.

Australian communication dated Aug. 8, 2017 in corresponding Australian patent application No. 2014233147.

European communication dated Jul. 18, 2017 in corresponding European patent application No. 14764-440.5.

* cited by examiner

| Item | Feature | Physics | Frequencies |
|---|---|---|---|
| 1 | Reactive chamber | refection, destructive interference, dissipation | low |
| 2 | Changes in cross-sectional areas | refraction and diffusion of wave energy | all |
| 3 | Boundary-layer disruption, turbulence | diffuse wave energy | medium-to-high |
| 4 | Absorbing materials: | absorption | high |

THERMOELECTRIC DEVICE

FIELD

Aspects of the present disclosure relate generally to apparatuses and methods that may be used in cooperation with thermoelectric systems.

DISCUSSION OF RELATED ART

Thermoelectric generators are devices that convert thermal energy, arising from a temperature difference, into electrical energy using a phenomenon called the "Seebeck effect."

Due to their ability to convert thermal energy produced by a temperature difference directly into electricity within a compact solid-state form, thermoelectrics have received a significant amount of attention. For instance, thermoelectrics may be useful for efficiently recovering waste heat at high temperatures from energy-intensive platforms, such as combustion engines in automobiles.

Conventional TEG systems pose challenges, particularly at high temperatures due to thermal expansion effects, resulting in difficulties in reliability, packaging (i.e. size, weight, versatility), and performance. Furthermore, these challenges often lead to system designs that require increased levels of complexity to be viable, which also increases cost.

SUMMARY

The present disclosure relates to novel designs of a thermoelectric device and optional features for a broad range of applications, particularly those related to thermoelectric generation at high temperatures, although applications for embodiments presented herein may involve fluid conditioning as well. The unique designs described are capable of overcoming or circumventing several challenges facing existing thermoelectric systems that limit market acceptance in terms of system performance, mobility (size, weight, reliability), versatility, and cost.

In an embodiment, a thermoelectric device is provided. The device includes at least one heat exchanger; at least one thermoelectric layer in thermal communication with the at least one heat exchanger; and an enclosure surrounding the at least one thermoelectric layer and the at least one heat exchanger, the enclosure providing a barrier for the at least one thermoelectric layer and the at least one heat exchanger from a fluid located outside of the enclosure, wherein a portion of the enclosure is adapted to conduct heat and is in thermal communication with the at least one thermoelectric layer, and wherein the at least one heat exchanger is spaced from and movable relative to an inner surface of the enclosure to accommodate for thermal expansion of the at least one heat exchanger and the enclosure.

In another embodiment, a thermoelectric system is provided. The system includes a duct defining a flow space that houses a fluid flow stream, the duct having an inlet arranged to accommodate fluid entry into the flow space and an outlet arranged to accommodate fluid exit out from the flow space; and a thermoelectric device disposed within the flow space. In related embodiments, noise dampening components may be provided with respect to embodiments of thermoelectric devices, for example, within the flow space of ducts.

In another embodiment, a thermoelectric structure is provided. The structure includes a heat exchanger having an inlet, an outlet and channels adapted to route fluid flow between the inlet and the outlet; a first thermoelectric layer rigidly attached to a first side of the heat exchanger; and a second thermoelectric layer rigidly attached to a second side of the heat exchanger, opposite the first side.

In another embodiment, a heat exchanger is provided. The heat exchanger includes a conformable surface adapted to conform substantially to a shape of a structure disposed adjacent to the surface; and a plurality of thermally conductive members extending from, surrounding and in contact with an outer region of the conformable surface, the plurality of thermally conductive members adapted to transfer heat between the conformable surface and a surrounding environment.

In an embodiment, a thermal switch is provided. The thermal switch includes a a channel separating a first structural component and a second structural component; and a fluid composition enclosed within the channel configured such that a thermal conductivity between the first and second structural components changes as the fluid composition changes phase between liquid and vapor at its boiling temperature.

In yet another embodiment, a thermal interface composite is provided. The thermal interface composite includes a conformable surface sheet adapted to conform substantially to a shape of a structure disposed adjacent to the surface; and a composition disposed on at least one side of the conformable sheet surface providing a higher thermal conductivity across an interface formed between two components in contact with and disposed on opposite sides of the conformable surface sheet than without the composition.

Advantages, novel features, and objects of the present disclosure will become apparent from the following detailed description when considered in conjunction with the accompanying drawings, which are schematic and which are not intended to be drawn to scale. For purposes of clarity, not every component is labeled in every figure, nor is every component of each embodiment shown where illustration is not necessary to allow those of ordinary skill in the art to understand aspects of the present disclosure.

BRIEF DESCRIPTION OF THE DRAWINGS

The accompanying drawings are not intended to be drawn to scale. In the drawings, each identical or nearly identical component that is illustrated in various figures is represented by a like numeral. Various embodiments of the present disclosure will now be described, by way of example, with reference to the accompanying drawings.

DETAILED DESCRIPTION

Figure 1:
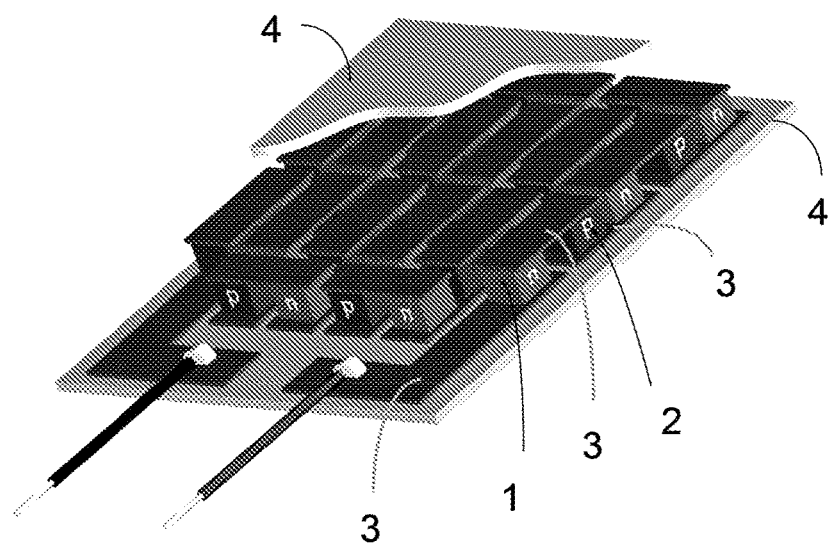
FIG. 1 illustrates a perspective view with a partial cutaway of the top ceramic of a thermoelectric module device.

The present disclosure relates to thermoelectric devices that may have an architecture which may be useful for a variety of applications, including thermoelectric generation (e.g., exhaust system from a combustion engine including, but not limited to those in vehicles) and fluid conditioning (e.g. heating and cooling of fluids). Various embodiments of thermoelectric devices in accordance with the present disclosure are able to perform thermoelectric conversion between thermal and electrical energy.

Certain embodiments of thermoelectric devices and systems described herein are capable of operating reliably, for example, as thermoelectric generators (TEGs), drawing energy from a thermal gradient provided, at least in part, from a high temperature fluid (e.g., up to 700 degrees C. and higher) located on a "hot-side" of the device. As such, embodiments of the present disclosure may allow for large temperature differences to exist between the "hot-side" and the "cold-side" of a TEG, which generally allows for stable production of electrical energy. Operation of such devices may allow for heat transfer from a hot fluid to a comparatively cooler fluid via a novel heat exchange system of components that incorporates thermoelectric materials that may be used to convert a portion of the heat transferred directly into electricity.

In some embodiments, a thermoelectric device includes one or more heat exchangers in thermal communication with one or more thermoelectric layers. The heat exchanger(s) may include an inlet, an outlet and channels adapted to route fluid flow therethrough. In some cases, thermoelectric layers may be disposed on opposite sides of the heat exchanger(s). The thermoelectric layer(s) may or may not be rigidly attached to the heat exchanger(s).

An enclosure may surround the thermoelectric layer(s) and the heat exchanger(s), providing a barrier from fluid (e.g., hot flow stream) located outside of the enclosure. In some embodiments, the enclosure may itself behave as a heat exchanger, and may thermally conduct heat between the outside surroundings and the thermoelectric layer(s). In some embodiments, the heat exchanger(s) may be spaced from and movable relative to the inner wall of the enclosure, which may accommodate for thermal expansion effects that arise between the heat exchanger(s) and the enclosure.

As described herein, the enclosure of a thermoelectric device may act as a heat exchanger. In some embodiments, a heat exchanger (e.g., which encloses other components, such as thermoelectric layers or other heat exchangers) may include a conformable surface adapted to conform substantially to the shape of a neighboring structure (e.g., thermoelectric layer disposed adjacent thereto). In some embodiments, the conformable surface may include a suitable composition that serves to enhance the thermal conductivity of the conformable surface. The heat exchanger may further include one or more structural members (e.g., heat conducting fins) that extend therefrom, which may be suitable for transferring heat between the conformable surface and the surrounding environment.

Conventional thermoelectric modules for electrical generation used in low-to-moderate temperature applications (typically <275 degrees C. on the hot-side) are relatively thin planar devices similar to that shown in FIG. 1. The module shown in FIG. 1 is made up of a series of thermoelectric couples, each including n-type 1 and p-type 2 thermoelectric materials electrically-connected by metallic interconnects 3. A plurality of these couples are interconnected together forming an electrical circuit, producing electricity when heat flows through the couples. Heat flow is driven by a temperature difference between the hot and cold sides of the couples (e.g. module).

Figure 2:
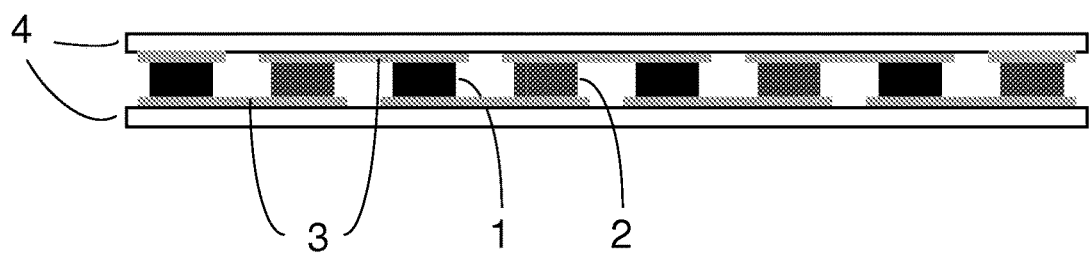
FIG. 2 shows a cross-sectional view of the thermoelectric device of FIG. 1.

The circuit of FIG. 1 is electrically-insulated on opposite sides, which is often achieved by providing ceramic substrates 4 mechanically coupled to the metallic interconnects. The process of mechanically coupling the ceramic substrates to the metallic interconnects, called metallization, involves rigidly attaching a ceramic substrate to the hot side (which appears cut away in FIG. 1 so the circuit arrangement is viewable) and another ceramic substrate to the cold side of the circuit. A cross-sectional view of a conventional thermoelectric module is further shown in FIG. 2. Such thermoelectric modules are solid state and lacking in moving parts.

Figure 3:
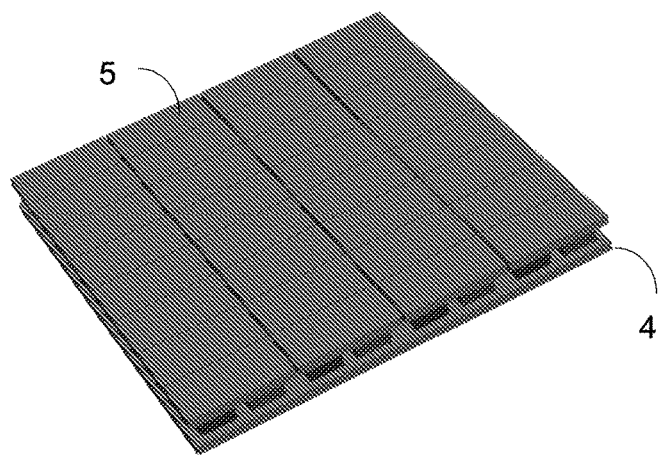
FIG. 3 shows a perspective view of a thermoelectric device in accordance with some embodiments.
Figure 4:
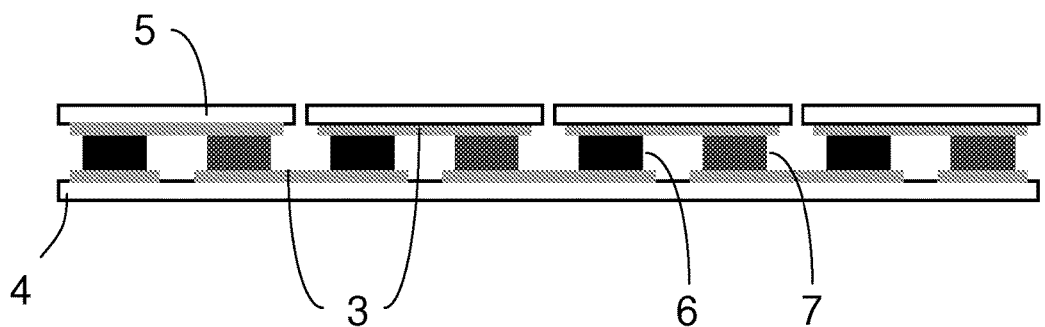
FIG. 4 illustrates a cross-sectional view of the thermoelectric module device of FIG. 3.

However, the high temperatures of such applications pose significant challenges to meet requirements for performance, mobility (i.e. compact, lightweight, reliability), and cost, for modules, devices, and systems incorporating thermoelectrics For example, as shown in FIGS. 3 and 4, a conventional high-temperature thermoelectric module (>300 degrees C. for the hot-side temperature) often requires high performance thermoelectric materials 6, 7 to perform at high temperatures. Thermoelectric modules also often require a singulated hot-side ceramic 5 for each thermoelectric couple in order to compensate for significant thermal expansions and stresses incurred from the substantial temperature gradient produced between the hot-side and the cold-side. As shown in FIG. 3, for this embodiment, the top side 5 and bottom side 4 represent hot and cold sides, respectively. In addition, most thermoelectric materials at such higher temperatures often require operation within an inert environment to protect them from oxidation, typically requiring a sealed enclosure within a device or system Conventional thermoelectric generator (TEG) systems often involve a coolant heat exchanger and thermoelectric materials which are disposed outside of a duct that confines hot gas flow. These TEG systems are also heavily integrated into the duct, whereby the system is intimately attached to the duct. The duct is used as a hot-side heat exchange base surface on which fins are attached. Heat is transferred through the fins and duct from the hot fluid, to the thermoelectrics, located outside of the duct, and ultimately rejected through the coolant heat exchanger. Typically, these systems include an outer shell in conjunction with the duct and other components, forming a cavity or enclosure, that contain and protect the thermoelectrics and coolant heat exchanger from the external environment.

As discussed above, a number of issues arise when implementing conventional thermoelectric systems, particularly at high temperatures. However, thermoelectric devices and systems in accordance with the present disclosure overcome many of the problems associated with traditional thermoelectric systems.

Although embodiments disclosed herein, in a number of cases, describe device and components in the context of generating power, the thermoelectric devices presented herein may also be adapted for conditioning a fluid as well, for either cooling or heating, which, in some cases, may affect the overall temperature and/or tendency for chemical reaction of a fluid. For fluid conditioning applications, electricity may be used to power thermoelectric materials so as to direct thermal energy to or from the fluid. Such adaptations may employ certain embodiments that include device architectures in accordance with those disclosed herein.

Various embodiments of thermoelectric devices as well as components thereof may include any suitable shape, for example, cuboid, cubic, cylindrical, or other shapes, or combinations thereof. One embodiment of a thermoelectric device that lends itself to compactness is a device having a low-profile rectangular cuboid shape, as illustratively presented herein.

It can be appreciated that, as provided herein, a shape that is substantially similar to a rectangular cuboid is not required to exhibit strict attributes of a cuboid. For instance, respective edges and corners of the rectangular cuboid may exhibit gradual transitions (e.g., rounded, tapered, beveled, etc.) and other features, such as depressions, transitions, notches, fins, indents, protrusions, etc., may be exhibited anywhere, which may deviate from strict attributes of a cuboid. Such shapes may have any suitable dimensions, whether they are features within or along the cuboid or at its periphery.

In various embodiments, as discussed above, the thermoelectric device architecture includes an enclosure, wherein a portion of the enclosure transfers heat between a hot fluid, which surrounds the device, and internal components within the enclosure. The enclosure, which itself is made up of one or more components, defines an enclosed space that provides a protective barrier for internal components within the enclosed space from the hot fluid located outside and surrounding the enclosure. In some cases, the surrounding fluid might not be the only source of heat, as combustion or another high-temperature heat source may emit significant thermal radiation to irradiate the device.

In some embodiments, the thermoelectric device includes a gastight enclosure, however, it can be appreciated that strictly gastight enclosures are not necessary for every embodiment of the enclosure. Components that make up the enclosure may function as a protective barrier or, in addition, may be used for other purposes of the device (e.g., heat transfer, thermal interface with inner thermoelectrics, structural support, etc.). Furthermore, the enclosure may compensate or otherwise accommodate for thermal expansion among the components of the assembly, which may arise from temperature gradients there across, for example, between the inside of an enclosed heat exchanger and the outside of the enclosure.

In certain embodiments, the enclosure surrounds at least one thermoelectric layer made up of thermoelectric materials which, in turn, surround a portion of at least one coolant heat exchanger. The cold-side of the thermoelectric layer may be in thermal communication with the coolant heat exchanger while the hot-side of the thermoelectric layer may be in thermal communication with a portion of the enclosure. In addition to including surfaces that are thermally conductive and thermally communicate with the thermoelectric layer, the coolant heat exchanger may also include inlet and outlet headers to manage flow in and out of the coolant heat exchange section(s), and extensions to the headers (or tubing) to route coolant flow to and through the enclosure wall.

While components internal to the enclosure are contained therein, these components, in some embodiments, need not be substantially attached to the enclosure (described in further detail below). For example, the heat exchanger may be spaced from and movable relative to much of the inner surface of the enclosure to accommodate thermal expansion of the heat exchanger and the enclosure. Additionally, the exterior surface of the enclosure may optionally include structural components/members (e.g. a plurality of fins extending from the enclosure) that may enhance heat transfer between the enclosure and the fluid located outside of the enclosure.

Figure 5:
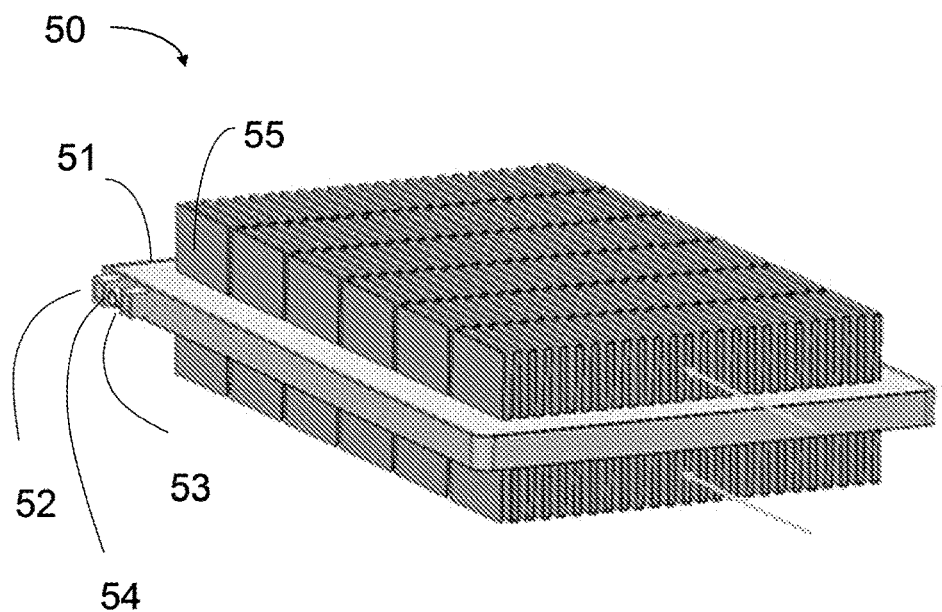
FIG. 5 shows a perspective view of another thermoelectric device in accordance with some embodiments.

In some embodiments, the thermoelectric device architecture includes components resembling substantially low-profile, planar forms (e.g. substantially flat and relatively short in height) and is illustratively shown in FIGS. 5-8. FIG. 5 illustrates fluid flow over and surrounding a cuboid-shaped thermoelectric device 50.

In some embodiments, the thermoelectric device 50 includes an enclosure 51 with an inside surface on which thermoelectric layers 63 are disposed. The thermoelectric layers may surround, on opposite sides, a low-profile coolant heat exchanger 64, which includes one or more substantially flat heat exchange sections. The shape of the heat exchange section(s) may allow for an overall enclosure shape substantially similar to a low-profile rectangular cuboid. A shape that is low-profile is one in which its width and length, which may or may not be the same, are substantially greater than its height, often greater than a factor of two; factors of 5 to 20 may be common.

Coolant flow enters the enclosure through an inlet 52 and exits through an outlet 53 and is routed to the inner heat exchanger components (e.g. routing tubes, headers, heat exchange component(s)). Electrical wiring (i.e. for thermoelectric power, control, sensing) may route through the enclosure at an electrical wiring port 54 and to thermoelectric layers and any other control or sensing component within the enclosure.

Fins 55 may be included on opposite sides of the enclosure to enhance heat transfer from a hot fluid that surrounds and flows over the thermoelectric device. The fins may be designed to be of a shape and pattern that meets certain requirements for a desired application. It can be appreciated that the presented fin design depicted in the figure is generic and not necessarily a preferred embodiment. In a motor vehicle exhaust system, for example, fin density would generally not be so high such that excessive pressure drop would be incurred, increasing backpressure at the engine outlet, and ultimately reducing engine efficiency. However, too low a fin density may generally result in lower enclosure temperatures for a given hot fluid temperature, resulting in a reduction in thermoelectric device output performance.

A number of fin pattern options may be employed, for example, louvered, strip, lanced, offset, perforated, etc. Fins may be adapted to extend outward from portions of the enclosure, and may optionally exhibit different cross-sectional areas, patterns, or geometry along the enclosure for the same device. The fins may be formed as an integral part of the enclosure (e.g. extruded enclosure with fins) or joined as separate fin components to a portion of the enclosure surface.

Figure 6:
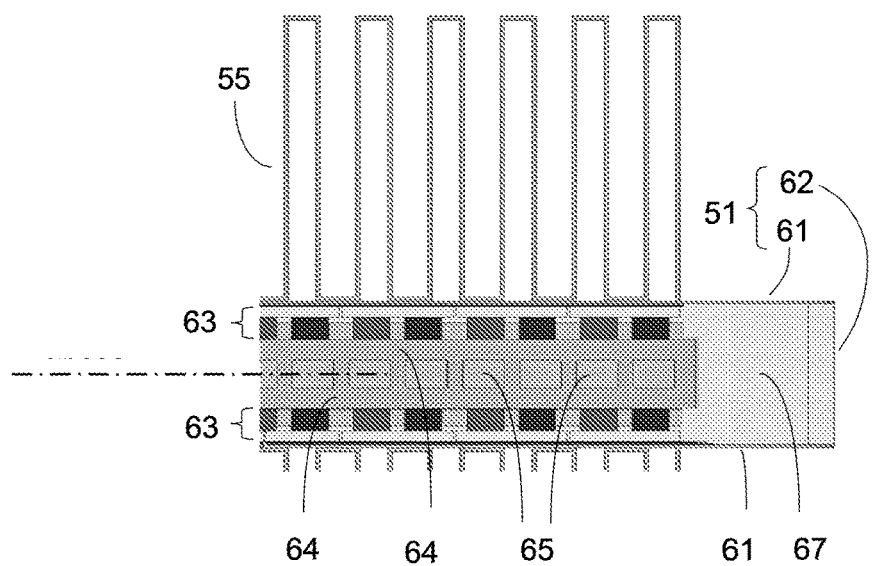
FIG. 6 shows a cross-sectional view of a lateral plane through the thermoelectric device of FIG. 5.

FIG. 6 depicts a cross-sectional view through a lateral plane of an embodiment of a thermoelectric generator, showing the internal components within the enclosure as well as the fins 55 extending outward from the top and bottom surface of the enclosure. FIG. 6 illustrates a substantially symmetric geometry about the horizontal plane represented by the dotted line. (In FIG. 6, the bottom fins are mostly hidden from view for viewability of internals).

The enclosure 51 contains components for power generation including two layers of thermoelectrics 63, each disposed on two opposite sides of the coolant heat exchange section 64. The coolant heat exchange section 64 is cooled by coolant fluid flowing through passages 65 (e.g. channels that extend in and out and perpendicular to the plane of the cross-sectional view) and, in turn, cools the cold-side portion of the thermoelectric layers 63.

As evident in the figure, this architecture results in substantial symmetry about a horizontal plane that runs through the center of the coolant heat exchanger. This symmetry provides a relatively simple and compact architecture and also plays a role in maintaining flat, interfacial assemblies of the device, for example, by significantly reducing out-of-flatness effects due to mechanical stresses from thermal expansion, which may occur due to large temperature gradients across the assembly (from hot enclosure to cold heat exchanger) within such a compact structure, discussed further below.

The enclosure further includes base sheets 61 (or plates) that, in some embodiments, may sandwich and compress the internal components on opposite sides of the internal architecture together, creating contact pressure at the interfaces of the components. The hot-side portion of the thermoelectric layers 63 interface may, for example, be thermally coupled with the enclosure base sheets 61. As further shown, a peripheral space 67 is provided over which the enclosure base sheets 61 extend or overhang, which is walled off by a side wall 62. In some embodiments, this sidewall 62 spans the distance between the top and bottom base sheets 61. The sidewall may be in contact with, may be attached to (e.g., adhered, joined, fastened, clamped, welded, brazed), or may be integrally formed with one or more of the sheets (e.g. extruded, stamped, drawn) of the enclosure 51.

Various embodiments of the side wall may depend on the type of enclosure employed (as discussed later). In some embodiments, the space 67 contains additional components that isolate the internals from the periphery (e.g., radiation barrier, insulation, etc.) and/or supplement the type of enclosure employed (as discussed further below).

Figures 7, 8:
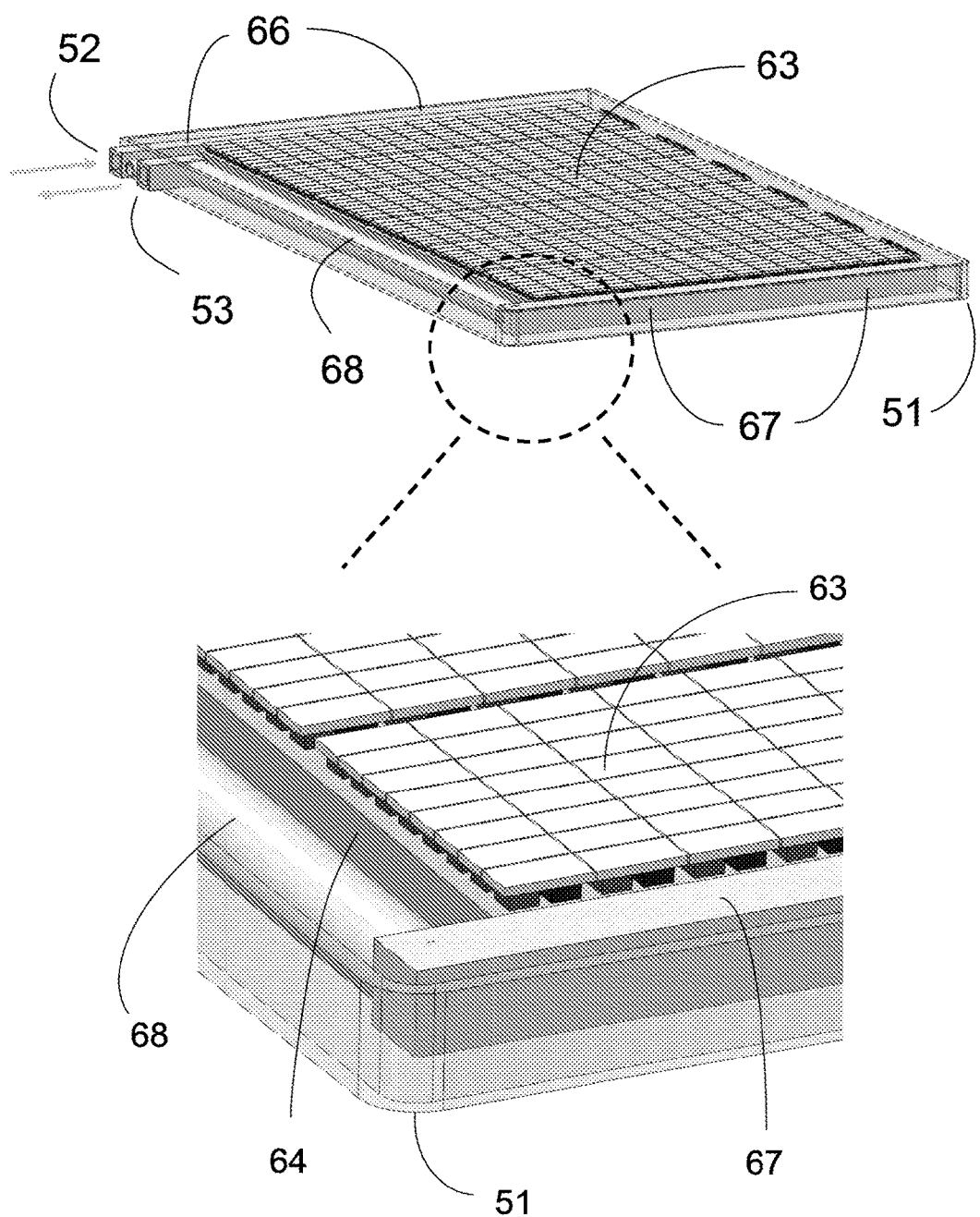
FIGS. 7 and 8 illustrate a perspective view of yet another thermoelectric device in accordance with some embodiments.

An overall layout of the internal components is shown in FIGS. 7 and 8 and may reside within the enclosure 51 (the enclosure is shown to be transparent in these figures so that the internal components are visible). Once the coolant fluid enters the enclosure through inlet 52, the coolant fluid is directed by the inlet header 66 into the passages 65 within the coolant heat exchange section 64. The coolant fluid facilitates heat transfer (e.g., by convection) away from the heat exchange section 64, which is in contact with the thermoelectric layers 63 that surround the top and bottom surfaces of the heat exchange section 64, resulting in thermal communication therebetween. The coolant fluid flows into the outlet header 67, resulting in a counter-flowing heat exchange through the TEG, where the hot fluid over the enclosure flows in an opposing direction. It can be appreciated that coolant flow may also be directed to flow in the opposite direction, if desired. The coolant is then routed from the outlet header 67 to an outlet tube 68 which eventually discharges the coolant fluid from the enclosure at the outlet 53.

This overall architecture provides a basic form which may be adapted to provide a compact structure that enables improved thermoelectric performance over a wide range of flow conditions (e.g. temperatures, fluid types, fluid flow rates) while relatively simple, versatile, and potentially cost-effective for numerous applications.

In various embodiments, the enclosure is hermetically-sealed under vacuum, and its base sheets 61 conform to and press against the hot-side surfaces of the thermoelectric layers 63. The base sheets 61 of the enclosure may form a thermal interface (e.g. be in thermal communication) with and generally slide along respective inner surfaces of the enclosure sheets. For some embodiments, in general, the thermoelectric layers may remain unattached from the conformable enclosure.

The compression and resulting contact pressures that arise along the respective interface(s) of the thermoelectric layer(s) and enclosure sheet(s) may result from a vacuum-applied differential pressure provided over the top and bottom sheets or portions of the enclosure. Accordingly, the pressure outside of the enclosure (e.g. atmospheric pressure) may be greater than the pressure inside the enclosure (e.g. sub-atmospheric pressure, vacuum). In such an arrangement, relatively even and uniform contact pressure distributions along the interface may be achieved, even if the surface of the thermoelectric layer is not perfectly flat because the enclosure sheets are thin enough to bend elastically and, in some cases, stretch without yielding. Such elasticity allows for the sheets to conform to the hot-side surfaces of the thermoelectric layer(s). While for some embodiments, the cold-side surfaces of the thermoelectric layer(s) are mechanically coupled to the heat exchanger, it can be appreciated that not every embodiment requires such a configuration. In this case, vacuum-applied pressure distribution may also serve to compress and sandwich the internal components of the thermoelectric device together so as to provide suitable thermal interface contact pressures for heat transfer at other component interfaces as well.

Conformability also enables the enclosure to adjust and continue to transmit well-distributed compressive pressures along thermal interfaces of the device, over a wide range of device operation. The ability for the enclosure to slide relative to and/or physically conform to the thermoelectric layers around which the enclosure is disposed allows for dynamic compensation of the effects of thermal expansion, even at extremely high temperatures, which may include temperatures up to 700 degrees C. or more.

Consequently, a conformable enclosure under vacuum, for example, provides a simple manner through which to meet challenging requirements under relatively severe conditions so as to achieve effective thermal interfaces, while also circumventing the use of conventional and bulky compression or fastening mechanisms; such mechanisms may require structures that are relatively thick and bulky so that their fastening mechanisms (i.e. bolts, springs, etc.) can suitably transmit force (often excessive, but commonly present) in order to distribute pressure, in a relatively uniform manner, to interface contact areas. As a result, these conventional approaches yield systems that are not very compact or lightweight.

While the enclosure may include any suitable material, in some embodiments, the enclosure includes sheets that are thin enough to bend elastically yet without yielding, allowing the sheets to conform, for example, to surfaces of the thermoelectric layers. A variety of enclosure materials may be employed, from plastics to metals, for example. Thin sheets may include one or more metals, as many metals possess elastic properties up to a limit (e.g. the yield point).

As described herein, elasticity is the ability for a material to return to its original shape after being subject to mechanical stress (e.g., bending, stretching). Furthermore, the thinness of the sheet to achieve enclosure conformability may also reduce the overall conduction path (e.g. thermal resistance) through the enclosure. This otherwise increased ability for heat to be conducted through the enclosure sheet may improve thermal performance of the enclosure for a given material, and/or may enable the use of alternative materials that may have relatively lower thermal conductivity, yet have suitable properties for appropriate applications (e.g., higher yield strength, corrosive resistance, etc.). Corrosive-resistant materials for the enclosure and/or fins may be preferable for high-temperature applications involving corrosive and oxidizing fluids, such as engine exhaust flows. A discussion of material options and manufacturability and assembly is provided further below.

Any fins attached to the enclosure may be designed so as to not overly restrict enclosure conformability. One such embodiment of a fin arrangement, shown in FIG. 9, involves a number of fin strips joined to the enclosure base sheet 61. In various embodiments, a fin strip may include a strip of material that is formed into a shape that appears as a wave form, as viewed from the air inlet to the fins (i.e. square, rectangular, sinusoidal, etc. or a combination of these shapes). Such arrangements may also have louvers or other flow enhancements cut or added into the fin strips.

Figure 9:
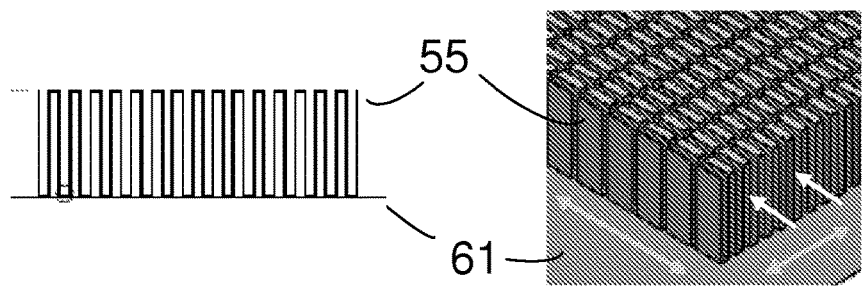
FIG. 9 depicts a strip fin arrangement in accordance with some embodiments.

The arrangement shown in FIG. 9 is a rectangular square form that is relatively tall, with shorter fin spacing (fins per inch), as depicted in the figures. This fin arrangement includes repeating rows of separate strip fins 55 which also exhibit a relatively short flow length (which is in the direction of fluid flow), whereby a suitable amount of space exists between each fin strip row (i.e. inter-fin spacing) so that individual fin strips will not interfere with one another when the heat exchanger (e.g., conformable enclosure) conforms to a surface.

In certain embodiments, the flow length of an individual fin strip should not be too long, or, otherwise, will add more rigidity than is desired to the heat exchanger (e.g., conformable enclosure), negating its conformability in that region. For many embodiments, a maximum flow length of 0.51" may be used as a rule of thumb. Such fin arrangements allow for the base sheet to reasonably bend or conform in any direction, including planes that are lateral, longitudinal, and those in between these directions. This flexibility allows for the enclosure base sheet with fin enhancements to conform to imperfect substantially flat surfaces of the outward-facing thermoelectric layers.

Figure 10:
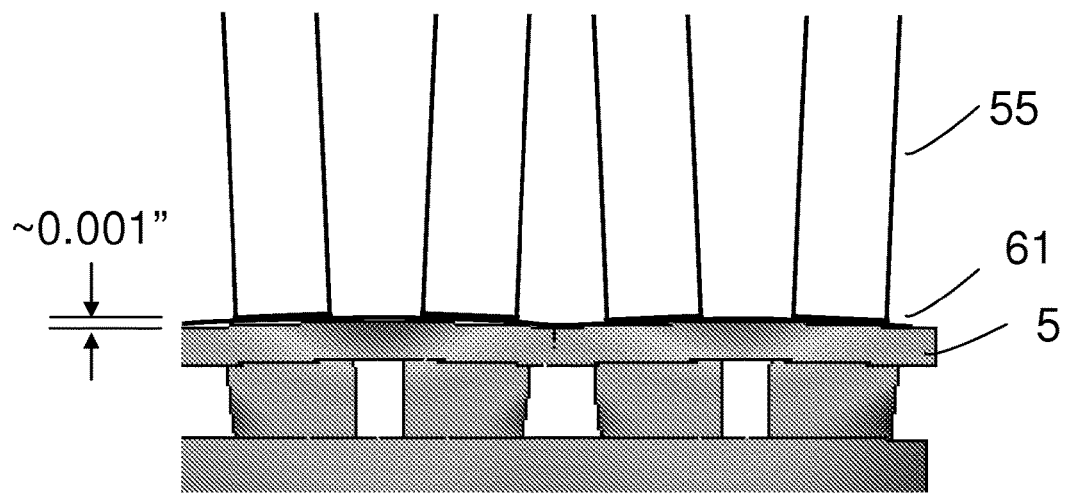
FIG. 10 shows a cross-sectional view of thermoelectric layer surfaces interacting with a conformable enclosure with fins, schematically illustrating thermal deflections during operation, where deflections shown to be magnified to illustrate the concept visually.

Other embodiments of fin types that may be adapted for use for a conformable heat exchanger include pin fins and joining individual fins into a base sheet (or fins formed with the base). For example, FIG. 10 conceptually depicts the enclosure conforming to thermoelectric layer surfaces within the lateral plane by showing two thermoelectric couples (singulated thermocouples) as they undergo significant deflection due to thermal expansion from the large temperature gradient across the thermoelectric couple provided by heat flow from the hot-side (top) to the cold-side (bottom) of the couple. (Deflections in FIG. 10 are visually exaggerated and magnified for visual perception.) Such thermal expansion, in some cases, causes the segmented ceramic to bow 'out-of-flat,' for example, on the order of 0.001". As shown conceptually, the conformable base sheet 61 (with fin arrangement 55) is able to conform substantially to the non-flat surface contours of the singulated ceramics 5. Of course, a base sheet without the fins may conform at least as well as, or better than, a base sheet with fins; nevertheless, fins may be designed so as to not overly restrict enclosure conformability.

Another fin embodiment may use a plurality of metal or ceramic substrates, where each fin may be relatively narrow and tall, so as to be attached to a conformable enclosure and arranged into an array, similar to that of the fin array described above. For ceramic substrate arrays, for some embodiments, substrates may be metallized to attach to a metal enclosure. Such substrate arrays may be used for an after-treatment device (i.e. catalytic converters, diesel particulate filters). Accordingly, this embodiment may be used as an after-treatment device which also produces thermoelectric power.

To further augment the effectiveness of the thermal interface between the thermoelectric layer and the base sheet of the enclosure, a thermal interface material (not shown in the figures) may be inserted between the thermoelectric layer and the base sheet. For instance, a thermal interface material may include a conformable graphite foil, copper foil, carbon nanotube pads and/or related materials, grease, among other options, and may be inserted in between the singulated ceramics 5 and the enclosure base sheet 61.

As evident in FIG. 6, the device architecture results in substantial symmetry about a horizontal plane that runs through the center of the coolant heat exchanger. This symmetry not only provides a simple and compact architecture, but also reduces the effects of out-of-flatness of components. Out-of-flatness components may include distortions or deflections including surface components that are no longer flush or parallel with one another, or when one or more of the components protrude, or jut out, with respect to other components, that would otherwise arise from mechanical stresses due to thermal expansions effects resulting from significant temperature gradients across the assembly (e.g., from hot enclosure to cold heat exchanger) within such a compact structure. Therefore, such symmetry further gives rise to an effectively flat interfacial assembly of components.

In a variety of embodiments, the thermoelectric layers 63 are movable (e.g., slidable) relative to the enclosure 51. In some embodiments, the heat exchanger (e.g. heat exchange section 64, inlet/outlet headers 66/67 and tube routing 68) is movable (e.g., slidable) relative to the enclosure and, as shown in the cross-section of FIG. 6, a portion of the heat exchanger is also spaced from the enclosure. However, as further shown in FIGS. 7-8, other portions of the heat exchanger are not spaced from the enclosure. For instance, the tubes that route the inlet 66 and outlet 68 coolant fluid through the enclosure side wall 62 at the coolant inlet 52 and outlet 53, respectively, pass through an opening of the enclosure, for suitable circulation of coolant therethrough.

The relative movability between the enclosure, thermoelectric layers and heat exchanger allows for adequate degrees of freedom during thermal expansions and contractions to avoid or otherwise reduce mechanical stress between components. For example, the hot enclosure (or hot heat exchanger) may be able to freely expand and slide along the thermoelectric layers, which reside on the cooler heat exchanger. The inlet tubing 66 and outlet tubing 68 that are attached to respective regions of the enclosure side wall 62, 63 may connect in near proximity, which still permits the enclosure to thermally move and expand freely. Additionally, these attachments may be located downstream on the device (with respect to hot fluid flow), where the enclosure and fluid temperatures are cooler.

Figure 11:
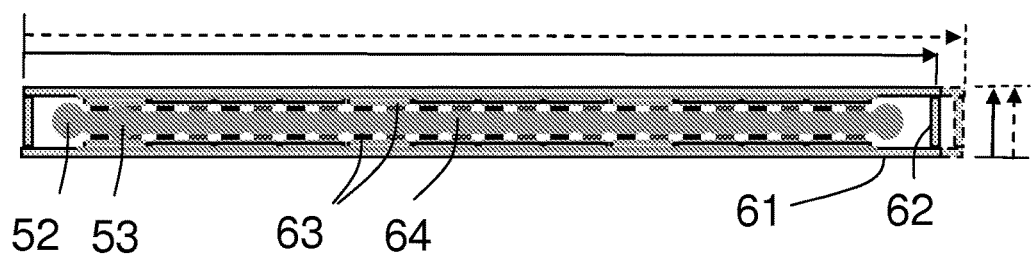
FIG. 11 depicts a longitudinal cross sectional concept view of the embodiment of FIG. 5 and schematically shows the thermal expansion effects in accordance with some embodiments.

In the planar direction (i.e. horizontal with respect to the cross-section shown in FIG. 11), which extends substantially along the large surfaces of the enclosure base sheets 61, as shown in FIG. 11, the enclosure base sheets 61 are configured to thermally expand upon an increase in temperature relative to the heat exchanger and thermoelectric layers 63 (as indicated by the dashed arrows) and, in effect, the sheets 61 are able to move and slide over the thermoelectric layers 63, which are in thermal interface contact with the enclosure base sheets 61. As the base sheets 61 slide along the thermoelectric layers 63, the base sheets 61 adjust and continue to conform and apply distributed thermal contact pressures to the internals. It is noted that in FIG. 11, optional fins are not shown for clarity in viewing other features.

Perpendicular to the planar direction, the enclosure expansion distance (that of the side wall, shown to be oriented along the vertical direction of FIG. 11) is much smaller due to its short height, resulting in little thermal expansion difference between the enclosure and internal components as compared to the amount of thermal expansion in the planar direction. In many embodiments, the side wall 62 may be more rigid than the base sheets so as to provide a frame that supports the peripheries of the top and bottom base sheets 61. According to this structure, the conformable top and bottom base sheets 61 compensate for the small thermal expansion (in a direction perpendicular to the plane defined by the top and bottom sheets) by continuing to conform and apply distributed thermal contact pressures to the internals.

In some embodiments, a high vacuum is used to achieve a desirable degree of conformability and thermal interface contact pressures. A high vacuum, which results, essentially, in an absence of a gas medium (or comparatively small presence of gas) also largely eliminates convective heat transfer within the spaces among the thermoelectric structures as well as between the enclosure and coolant heat exchanger. Otherwise, under certain operating conditions, such convective heat transfer could result in substantial thermal leakage(s), contributing to parasitic losses that degrade system efficiency. Furthermore, if internal components (e.g., thermoelectric materials) are sensitive to oxidizing environments, a high vacuum may eliminate any need for an inert gas; however, it can be appreciated that if a partial vacuum is desired, an inert gas (e.g., nitrogen, argon) may also be used, for example, to protect the internal components, for example, from oxidation.

In various embodiments, where the enclosure extends or overhangs beyond the thermoelectric layers 63 and portions of the coolant heat exchanger 64, 66, 67, 68, the enclosure periphery provides space to isolate and protect the components within the internal volume of the enclosure.

In some cases, structural reinforcements such as a brace may be used to support the thin enclosure sheet in the region of overhang, which otherwise, absent the brace, may tend to yield, fail, or collapse. Other structural elements may provide standoffs to position the internal components of the enclosure and limit their movement relative to the enclosure, providing further structural support for the device. Suspended radiation barriers such as reflective aluminum foil may also be used to reduce thermal radiative heat transfer (another form of parasitic heat leak) from the hot enclosure to the internals, such as to the heat exchanger headers. If desired, other types of structural reinforcements and insulators (i.e. aerogels, ceramics, etc.) may be employed, which may depend upon the enclosure manufactured design and/or whether or not a full vacuum is employed.

Figure 12:
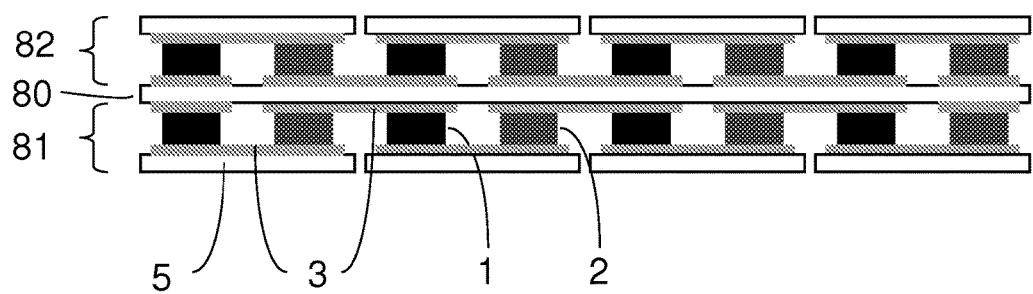
FIG. 12 illustrates a cross-sectional view of a two-stage high temperature thermoelectric module device in accordance with some embodiments.

The thermoelectric layers may be integrated into opposite sides of a ceramic coolant heat exchange section, which is substantially flat. This construction conceptually resembles a two-stage thermoelectric module, a cross-sectional view of which is shown in FIG. 12. Here, in this embodiment, the top ceramics are shown to be on the hot side and the bottom ceramics are shown to be on the cold side. In such a module, two different thermoelectric layers 81, 82 are attached to both sides of an intermediate flat solid ceramic 80. In an embodiment, a heat exchange section 64, which may be made of ceramic, metal, or other material, replaces the intermediate solid ceramic 80.

Figure 13:
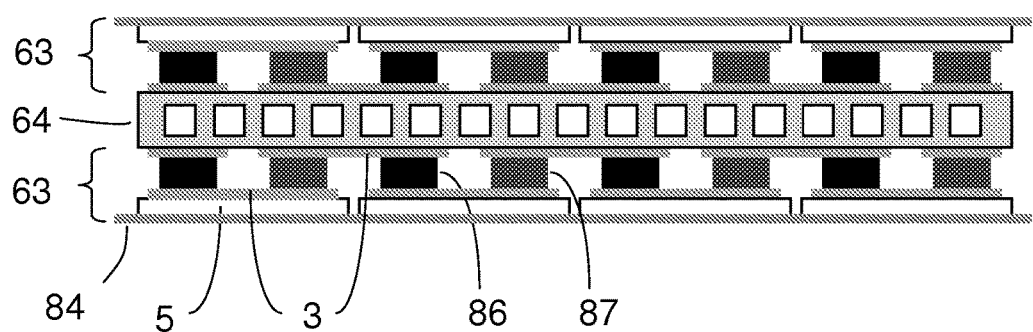
FIG. 13 illustrates a lateral cross-sectional view of another thermoelectric device in accordance with some embodiments.

A thermoelectric layer 63 incorporated into thermoelectric devices described herein may include any suitable thermoelectric layering or sub-layering arrangement. In embodiments of the present disclosure, two similar high-temperature thermoelectric layers 63 are mechanically coupled (e.g., rigidly attached) on opposite sides of a flat ceramic coolant heat exchange section 64, as shown in FIG. 13. As shown, the thermoelectric layers are integrated with a substantially flat heat exchange section. Accordingly, thermoelectric layers 63 may be provided as one-stage, two-stage, or any other multi-stage module arrangement, including one or more sub-layers, and not every layer among a plurality of thermoelectric layers need be the same design or materials for a given device. The cold-side interconnects of the thermoelectric layers 63 may be attached to the coolant heat exchange section 64 by any suitable manner, for example, by metallization of the ceramic heat exchange section for the metallic interconnects 3.

In some embodiments, high-temperature thermoelectric materials 86, 87 mechanically couple (e.g., rigidly bond) to and are sandwiched between the interconnects while the singulated ceramics 5 are metallized with and mechanically coupled (e.g., rigidly attached) to the hot-side interconnects. Finally, a thermal interface material 84 (e.g., conformable graphite foil, copper foil, grease, among others) may reside on the outward-facing surfaces of the singulated ceramics 5 and may function to further increase thermal contact between the thermoelectric layers and the enclosure.

An embodiment where an integrated thermoelectric is fabricated may involve attaching metal coolant inlet and outlet headers to the corresponding inlet and outlet of the ceramic heat exchange section. In some embodiments, such attachment may involve metallization. One embodiment may include metallization by directly using the header material. Another embodiment may involve lightly metallizing the ceramic and subsequently joining the header metal to the metallized ceramic such as by a brazing or other suitable technique. Metal headers may then be joined to a metal enclosure to receive or expel coolant fluid.

In another embodiment of the heat exchanger, a coolant heat exchange section and headers are made out of the same material, which may simplify the joining of these components by brazing or welding. Thermoelectrics could be integrated into a metal heat exchange section, which may include an electrically-insulating coating (not necessarily a ceramic coating) between the heat exchanger and the cold-side metal interconnects of the thermoelectrics. Similarly, for some embodiments, an electrically-insulating coating or material may be used between the hot-side interconnects of the thermoelectrics and the enclosure sheets, to attach thermoelectric layers, either bonded, joined, or coated on the interconnects or sheet or as a separate sheet between them.

Figure 14:
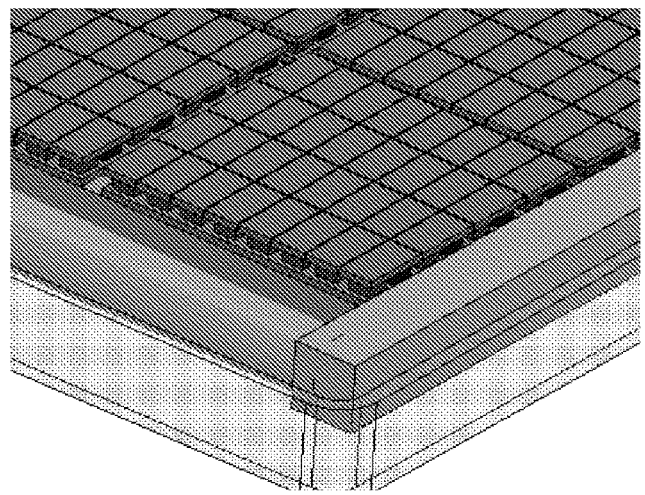
FIG. 14 depicts a close-up perspective view of thermoelectric modules in contact with a heat exchanger in accordance with some embodiments.
Figure 15:
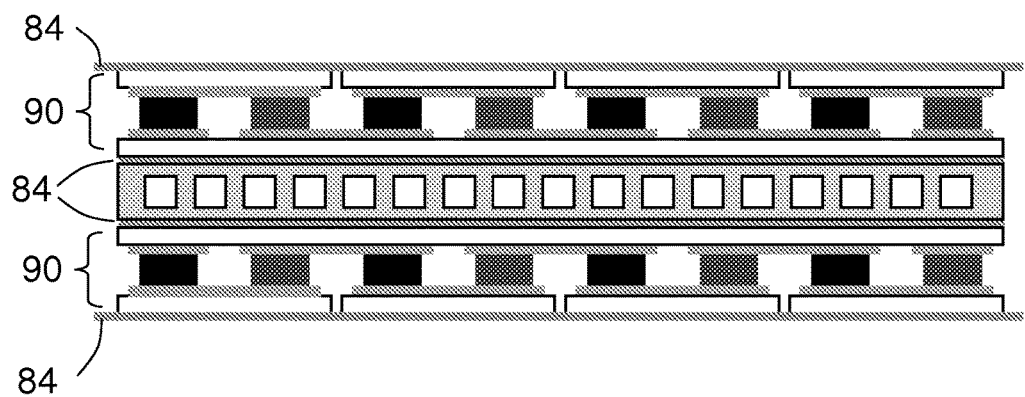
FIG. 15 illustrates a lateral cross-sectional view of another thermoelectric device in accordance with some embodiments.

In contrast to thermoelectrics integrated into the coolant heat exchanger as described in an embodiment above, another embodiment may optionally include separate planar thermoelectric layers or modules simply placed in contact and on both sides of a substantially flat coolant heat exchanger, as shown in FIGS. 14 and 15, which features high-temperature modules with singulated hot sides 90. This configuration may be assisted by thermal interface materials 84 on either or both of the sides of the module. In the illustrative embodiment of FIG. 15, separate thermoelectric modules are in contact with a substantially flat coolant heat exchange section.

Another embodiment used with a ceramic coolant heat exchange section may include a mechanical attachment (e.g. join, bond) of the cold-side ceramic to the ceramic heat exchanger to further improve cold-side thermal contact resistance. Yet, another embodiment may employ separate thermoelectric layers or modules but without ceramics on one or both sides, whereby on the side in absence of ceramic, an electrically insulating layer (either coating or separate sheet) is applied. Other varied embodiments may also be employed by one of ordinary skill in the art.

Figure 16:
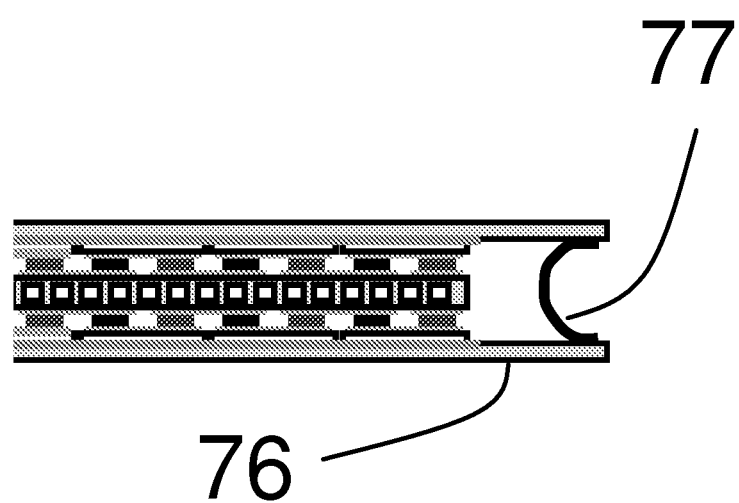
FIG. 16 shows a lateral cross-sectional view of a thermoelectric device with a compressible enclosure sidewall, in accordance with some embodiments.

Another type of enclosure, which has been described in a variety of embodiments, is a compressible or compliant enclosure sidewall, whereby one embodiment may take the form shown in FIG. 16. It is noted that optional fins and fastening mechanisms are not shown in this figure for simplicity. Different from a conformable vacuum enclosure whereby conformability of the enclosure occurs at the interface between internals and the base sheet and less at the side wall, if at all, the conformability of a compressible enclosure may be effectively reversed. That is, for some embodiments, the base sheet(s) may be less prone to conformability while the side wall(s) may exhibit a comparatively higher degree of conformability. In FIG. 16, a substantially semi-circular thin sidewall 77 may provide further compliance or flexibility for thermal expansion differences in the height direction (e.g. perpendicular to base sheets 76 which are more rigid), while capable of withstanding a high vacuum despite a relatively thin wall.

Yet, similar to the other enclosures described herein, the compressible enclosure provides a barrier of isolation and protection for the internal components which include the thermoelectric layers in contact with a coolant heat exchanger (and associated components), and overhangs the internals around the enclosure periphery, resulting in some space that is walled off by the flexible side wall 77. Also, as described above, the enclosure may be movable relative to the coolant heat exchanger to compensate for enclosure sheet or plate thermal expansion and contraction (in a direction parallel to plates).

In a variety of embodiments, the compressible enclosure may be gas tight, including embodiments with high vacuum, partial vacuum with or without an inert gas, or simply with an inert gas. This vacuum serves similar purposes as described in earlier embodiments and still provides compressive forces for internal component interfaces transmitted by the base plate.

In some embodiments, compressive pressures greater than those created by a vacuum can be achieved with the addition of mechanical fasteners including screws, bolts, springs in tension across the gap, among others, which may be implemented outside of the gastight enclosure and not interfere with enclosure sealing. Among other embodiments, using such fasteners, reinforcement members that laterally span across to tops of the fins provide further structural reinforcement throughout the fin and base plate structure to minimize base plate deflection and, in effect, provide well-distributed compressive interface pressures transmitted by the plates. In some embodiments, such reinforcement members may be periodically arranged, with any suitable geometric structure. For example, reinforcement members may be relatively wide or narrow with respect to one another, and arranged in an alternating wide-narrow configuration.

Other enclosure embodiments may not include a gastight compressible enclosure, allowing for simpler side wall constructions. Nevertheless, it may be preferable to employ mechanically compliant structures so as to maintain effective thermal interface between sliding components for applications involving high temperature operation in order to adjust for thermal expansions. For non-gastight embodiments, some of these constructions may range from attaching metal side walls or simply filling the enclosure with compressible insulation (which may still be a compressible version), or a combination of these approaches. For an incompressible or noncompliant enclosure (either gastight or not), relative compliance among the internal components may be achieved, such as a conformable or compliant thermal interface pad, which may possess some elastic properties, among other options.

The enclosure with a compressible sidewall or non-compliant enclosure approach may have similar thermoelectric characteristics to that of the conformable enclosure. For example, thermoelectric material may be integrated into or mechanically coupled to the surface of the ceramic(s) or metal heat exchange section(s) of the heat exchanger or enclosure base sheet(s). Or, entirely separate planar thermoelectric module(s) or layer(s) from other components may be employed.

Additionally, in a variety of embodiments, a compressible enclosure sidewall or non-compliant enclosure approach may have the thermoelectric materials integrated into the hot-side plates, whereby the cold-side of the thermoelectric layer may be in sliding thermal contact with the coolant heat exchange section, which may optionally incorporate a thermal interface material (e.g. thermal grease or sheet). Such integration would be similar to the methods discussed earlier related to thermoelectric integration into both ceramic and metal coolant heat exchange sections, except that these former integration approaches would be applied to the base of the hot-side metal or ceramic heat exchanger. Also, the cold-side of the thermoelectric layers may include segmented ceramics 5, instead of the hot-side, to alleviate thermal stresses.

As further described herein, the thermoelectric device may be used for after-treatment purposes. As another embodiment, hot-side metal or ceramic heat exchangers may also serve as a substrate to treat emissions in the hot fluid and function as an after-treatment device, serving such purposes as a catalyst (e.g., catalytic converter) or particulate filter. The enclosure, which may include a finned arrangement, may also include a coating configured to catalyze reactions of the fluid. These substrates may include many mini-channels and passageways resulting in much surface area which, in addition to catalytic surfaces, may also serve as heat exchange surfaces. Therefore, the thermoelectric device would serve a dual purpose: generating electricity and controlling emissions.

It can be appreciated that thermoelectric systems in accordance with the present disclosure may be adapted to include non-symmetric embodiments. For example, an embodiment that is substantially cuboid-shaped might only have one thermoelectric layer and one set of fins disposed towards one side of the device and, on the opposite side, no fins and an insulator in place of the thermoelectric layer to provide a thermal barrier between enclosure and inner heat exchanger. Other arrangements may also be possible.

In some embodiments, the thermoelectric device is substantially positioned within the interior volume of a duct that defines a flow space for housing or otherwise confining a fluid (e.g., hot fluid flow stream) that surrounds and flows over the exterior of the thermoelectric device. The duct may also include an inlet for accommodating fluid entry into the flow space and an outlet for accommodating fluid exit out from the flow space.

Figure 17:
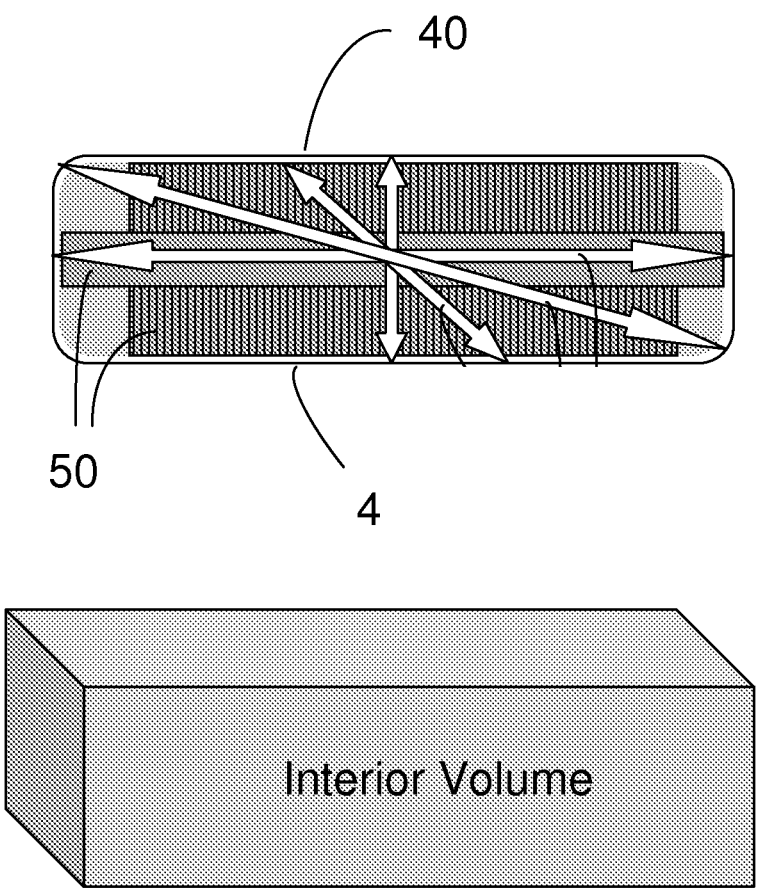
FIG. 17 depicts concept views of an interior volume, whereby arrows and the substantially cuboid shape represent an example of outermost lateral dimensions of a duct space.

As described herein and depicted in FIG. 17, the interior volume or, otherwise called, flow space of the duct is the outermost lateral dimensions of the volume that contains the fluid, as the fluid passes from the duct inlet to outlet. While the thermoelectric device 50 may be positioned within the interior volume or flow space of a duct 40, the device may remain substantially separate from the components of the duct without the requirement for heat transfer to occur between the thermoelectric device and the duct components; in other words, the device function does not require thermal communication with the structure (e.g., duct) that confines the fluid surrounding the enclosure.

In some cases, the device may be optionally spaced or otherwise thermally isolated from the structure. The device may be but need not be, spaced/thermally isolated from the structure. Thermal isolation, in the context of the present disclosure, is not required to exclude mechanical attachment or coupling with the surrounding structure. Rather, thermal isolation is understood herein to mean that the thermoelectric device is positioned relative to the surrounding structure so that any thermal communication that occurs between the device and structure does not substantially affect thermoelectric operation of the device.

In contrast, in conventional thermoelectric devices, for thermoelectric conversion to occur, the devices require thermal communication (e.g., being integrally coupled) with the surrounding structure (e.g., duct) that confines fluid flow so that a temperature gradient may be provided to the thermoelectric device. Otherwise, without such thermal communication (which provides an adequate temperature gradient), conventional thermoelectric devices would, essentially, not function for their intended purpose.

Conversely, embodiments of thermoelectric devices described herein may be formed separate and independent from the surrounding structure that confines the fluid flow stream. Accordingly, the thermoelectric device may be removably attached to the duct and, in some cases, have only a few attachment points that may mechanically suspend the thermoelectric device within the internal volume or flow space of the duct through which hot fluid flows.

Figure 18:
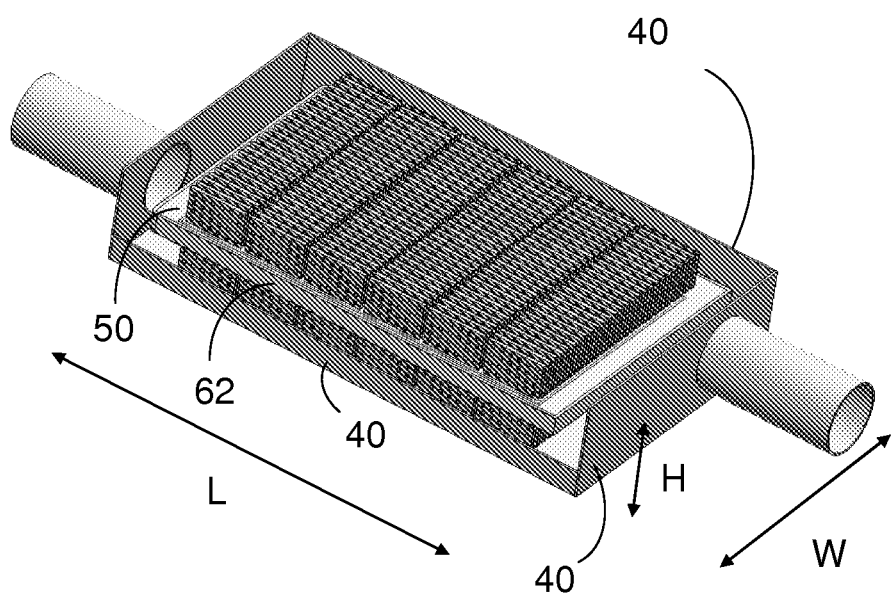
FIG. 18 shows a perspective view of a thermoelectric system in accordance with some embodiments, whereby a thermoelectric device is located within a duct space.

Inserting the thermoelectric device into a duct (e.g., vehicle duct, exhaust, etc.) is substantially similar to that of a heater core for a vehicle, except here, the thermoelectric device may be inserted into an exhaust duct and may use the coolant fluid for device cooling (instead of for occupant heating). For a passenger car application, FIG. 18 depicts one embodiment for the thermoelectric device 50 inside a duct 40 that may require minimal contact with the duct. The device may be suspended within the duct using mechanical couplings (not shown in the figures) located on each side of sidewalls 62 of the device enclosure.

As further described herein, other than inlet and outlet flow regions to the device, remaining space between the device and the duct walls may be filled with filler insulation to eliminate any flow bypassing the device (also not shown in FIG. 18 for device visibility). Some embodiments are stand-alone thermoelectric devices, wherein the duct inlet and outlets may be connected with piping from the engine exhaust system which may include muffler and/or after-treatment devices.

Since the device is self-contained and is not required to be heavily integrated with the duct that confines the fluid flow, the device may be considered modular. That is, the device may be easily incorporated or removed from the overall system. Due to this modularity, a thermoelectric system that is scalable in capacity is easily achieved by simply arranging a plurality of thermoelectric devices in parallel and/or in series within the flow space of a duct or multiple ducts.

Figure 24:
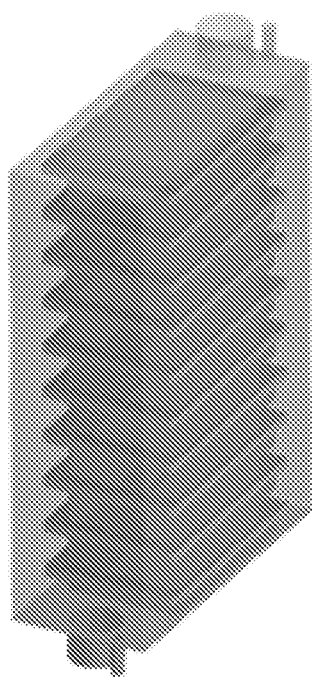
FIG. 24 shows a perspective view of a vertically-stacked thermoelectric system in accordance with some embodiments.

In accordance with the thermoelectric device disclosed herein, various embodiments may take the form of 10 devices in parallel and stacked vertically within a duct, as shown in an example in FIG. 24, wherein 5 kW of power would be delivered if each device generated 500 W. Similarly, other embodiments may include a horizontal stack of 8 devices, as shown in an example in FIG. 25, wherein 4 kW of power would be delivered if each device generated 500 W. This system is also coupled with an after-treatment device at the inlet which facilitates inlet flow transition to the duct while providing, overall, a very compact package.

Certain applications and embodiments may involve at least a portion of the fluid bypassing the device or bypassing a portion of the device. For example, in some cases, there may be hot-side fluid operating conditions, which may, in certain instances, exceed acceptable temperature limits for the device, causing overheating and potential failure. Accordingly, a fluid bypass which reduces or stops fluid flow over the temperature-sensitive regions of the device may be employed. In other cases, fluid flow may be excessive, creating too much backpressure, which may necessitate flow relief. In either case, this fluid bypass may serve to route some or all of the fluid flow through an alternative passage that runs parallel to fluid flow in the main duct, although such a bypass system may be implemented in a number of different forms.

Certain embodiments of the fluid bypass system may use the space where the fin width ends laterally on either side of the device, between the enclosure and the duct, as seen in FIGS. 17 and 18. For example, an additional partition wall may be included where the fin width ends to define a separate flow passage for a bypass.

In some embodiments, a flow space that is substantially larger than the device may be employed, where the device is substantially spaced off to one side of the duct, and a partition wall may be inserted adjacent to the side of the device so as to define a separate flow passage for fluid bypass.

Yet, in other embodiments, a completely separate duct altogether may be used, serving as the alternate fluid flow passage. Here, fluid flow may be controlled using a damper or valve, actuated either actively (e.g. solenoid, motor, etc.) or passively (e.g. thermally-activated material such as bimetal spring, shape-memory alloys, etc.).

Variants of the aforementioned embodiments may include a plurality of devices, whereby the bypass may be provided between adjacent devices.

In some embodiments, thermoelectric systems in accordance with the present disclosure include one or more thermoelectric devices combined with noise dampening components, which may be designed and manufactured into a duct, or flow space confined by a duct, to function both as a muffler and thermoelectric device, which is described herein as a thermoelectric muffler. Such a combination is synergistic and achieved with relative ease.

The thermoelectric device, which may include thermoelectric arrangements in accordance with various embodiments, may already have features in itself that attenuate noise. The thermoelectric device may also easily accommodate additional noise dampening features and materials. As described herein and understood to those of skill in the art, noise dampening components may include at least one noise dampening material, feature, or structure adapted to scatter, disrupt, dissipate or cause destructive interference of sound waves traveling within a fluid flow space, including a plurality of passageways, chambers, walls, perforated walls, tubes, perforated tubes, or acoustically absorptive material, and may or may not be an integral part of the device, duct, or other components of the system.

A characteristic of the device that provides certain advantages over conventional thermoelectric systems is that, for various embodiments, a substantial portion, if not the entirety, of the enclosure of the device and any fins extending therefrom are outward-facing and in contact with the surrounding fluid, while remaining unattached to the duct. In contrast, conventional thermoelectric devices require any such fins to be attached directly to the inside surface of the duct.

This characteristic of thermoelectric systems in accordance with the present disclosure, where fins extending from the enclosure are able to remain unattached to the inner wall of the duct, provides for a relatively large surface area and volume (e.g., particularly if the device is spaced from the duct) to be available for noise dampening components (e.g., located around the lateral periphery along the flow length of the device). The availability of additional surface area and volume may be beneficial for noise dampening, for example, by accommodating for the installation of noise dampening components. This arrangement allows for noise dampening components to be directly exposed to sound waves from the fluid that surrounds the device and, as such, may provide for enhanced dampening thereof. In accordance with various embodiments, the noise dampening components may be in mechanical contact with the device and/or the duct, or neither.

Similarly, amongst an arrangement of multiple thermoelectric devices within the flow space (e.g., within a duct), either in parallel or series arrangement, noise dampening components may be arranged between portions of two or more such devices. For example, arrangements of multiple thermoelectric devices in accordance with the present disclosure may include perforations, an access tube, or open hole within the immediate duct wall which provide one or more passageways to other chambers or other noise dampening components. Such arrangements may also be adapted to dampen noise of other acoustics for regions located between thermoelectric devices that are disposed in series (e.g. thermoelectric devices located upstream and downstream with respect to another).

Generally, fin pattern geometries are configured to disrupt fluid flow (i.e. by formation of fluid boundary layers) to enhance heat transfer and, thus, play a role in noise dampening. For a given fin pattern, a fin bank may have intermittent or periodic alterations in fin geometry along the direction of the fluid flow (e.g., louvered, offset, perforated, wavy, etc.) and, thus, contain small flow passages. Furthermore, offsetting fin geometries of fins with narrow fin sets, such as that shown in the illustrative example of FIG. 9, may provide for a distinct change in cross-sectional area in the direction of the flow. These characteristics may be effective in dampening noise, for example, by scattering, dissipating, and destructively interfering sound waves. The enclosure surface may also contribute to noise dampening, for example, by reflecting acoustic waves back into a surrounding fin bank, resulting in further absorption of wave energy. In some embodiments, noise dampening components can be inserted within fin banks, alongside of fins and sets of fins, and on top of fins.

For a low-profile rectangular or cuboid thermoelectric device, for example, in the context of converting engine exhaust heat to energy, the following may be applicable. It may be preferable for fluid flow to transition between tubes having a certain cross-section (e.g., round/circular tubes)—which may be typical of exhaust systems—and the cuboid-shaped thermoelectric device itself, through inlet and outlet volumes within the duct. These inlet and outlet volumes can easily be adapted to function as reactive chambers having protruding/over-extended tubes into chambers for greater reactive effects. To achieve balanced flow laterally through the thermoelectric device (e.g., TEG), the axes of the inlet and outlet piping may be arranged so as to be offset with respect to one another. This characteristic may be conducive to reactive dampening since this configuration reduces the ability of sound to directly be transmitted from inlet pipe to outlet pipe, resulting in greater distances for waves to travel and opportunities for waves to be deflected and dissipated.

Figures 21, 22:
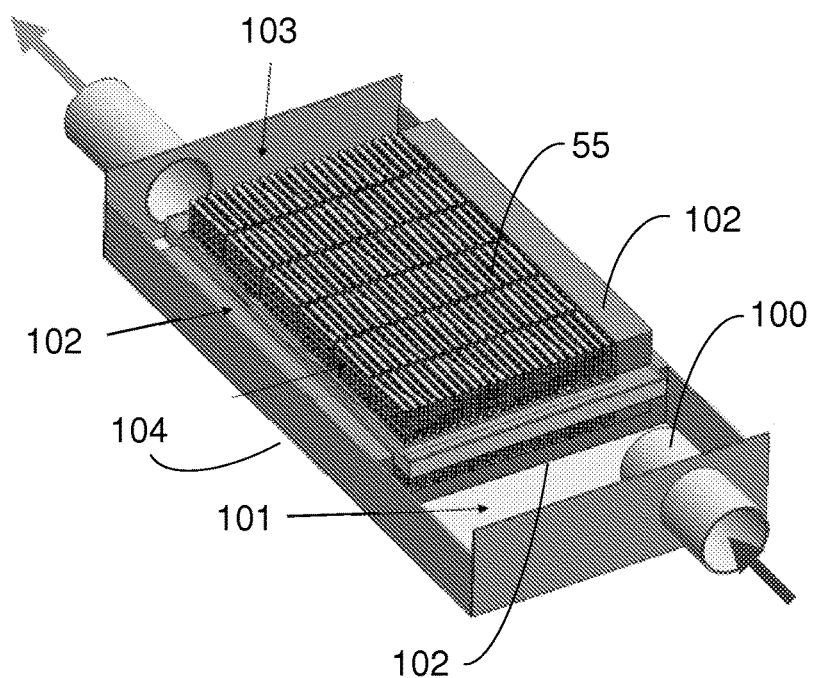
FIG. 21 shows a table of some types of noise dampening features and some characteristics for muffler systems in accordance with some embodiments.
FIG. 22 depicts a perspective view of a thermoelectric muffler system in accordance with some embodiments.

In some embodiments, noise dampening techniques described herein may be applicable to a thermoelectric muffler system for an automobile exhaust, which generates a noise signature over a very broad range of frequencies, for example, due to a wide range of automobile engine speeds. FIG. 22 presents one embodiment for this application, illustrating a thermoelectric device located within the space enclosed by a muffler. Accordingly, embodiments described herein has potential to achieve broad-band noise damping as an automotive muffler and employs similar noise dampening techniques and features as those found in reactive and absorptive mufflers, including those listed in FIG. 21.

In operation, the exhaust gas and sound waves enter the inlet tube 100 from the exhaust system connected to the engine. The exhaust immediately enters an expansion chamber 101 which is adapted to attenuate sound, from the change in cross sectional area; the concentrated wave entering the chamber from the inlet tube expands in the expansion chamber, having a comparatively larger volume, and dissipates its energy over larger surface areas. Accordingly, this larger volume reduces the overall intensity of the wave.

The sound waves expand out in the expansion chamber until they reach the side walls where the exhaust sound is further attenuated by the reflection of the sound pulses off the side wall of the muffler, followed by destructive interference with subsequent on-coming waves. Destructive interference is a reactive method of dampening which occurs when a sound wave interferes with another sound wave of equal or varying magnitude and phase and is typically achieved at lower frequency ranges (<500 Hz) by forcing the gas to pass through a series of chambers, tubes, and passageways. The inlet tube protrusion 100 further assists attenuation by allowing some waves to propagate in a direction opposite to that of the gas flow and reflect and dissipate against the front of the chamber, also allowing further opportunity for destructive interference.

A contraction of cross-sectional area occurs as the exhaust gas enters the device and travels through the fin arrays 55. The fin pattern shown here is generic but can be adapted to both achieve high heat transfer and noise attenuating properties by designing frequent changes in cross-sectional area and small passages (on a mini- and micro-length scale) as sound waves propagate through the thermoelectric device, resulting in wave scattering, dissipation, and destructive interference. Such changes in cross-sectional area may include any suitable fin design, such as those presented earlier in FIG. 9 as well as perforated, staggered, louvered, and wavy fins, among other types. Furthermore, the flow turbulence and boundary-layer disruption may also dissipate sound wave energy. This type of attenuation may be particularly suitable for dampening low-to-medium frequencies.

Figure 23A:
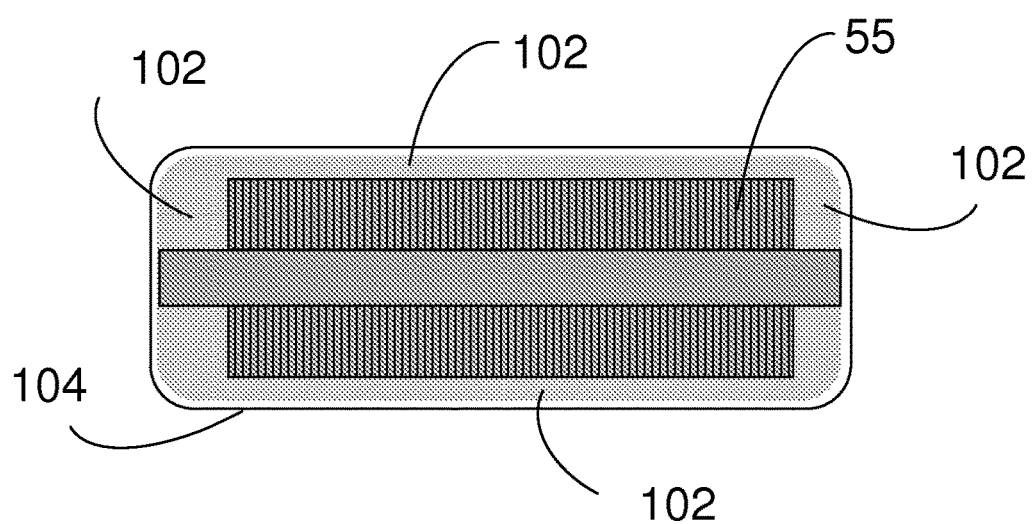
FIG. 23a illustrates a cross-sectional view of a thermoelectric muffler system in accordance with some embodiments.

While the exhaust flow travels through the fin arrays, sound waves are frequently scattered by the fins and reflected off of the outer surface of the enclosure, directing sound waves outward towards the device periphery and toward the duct perimeter 104 (e.g., the duct top, bottom, and side walls). Accordingly, the perimeter 104 of the duct may be lined with noise dampening components 102 (e.g., sound absorbing material including fiberglass) to dampen the exhaust sound, as shown in FIGS. 22 and 23a. Any sound absorbing material may use absorptive material which reduces the magnitude of vibration for all frequencies, particularly at higher frequencies (>500 Hz), and are typically used in absorptive silencers. The sound absorbing material may also function as a suitable heat insulator which reduces heat loss through the walls of the duct and further increases thermal performance of the thermoelectric device. (For the sake of visibility, portions of the duct are not shown in the figures on the top and some of the sides, and some sound absorbing material is also not shown on top and left sides above device. Also, coolant inlet and outlet to and from the duct is not expressly shown in the figures for added simplicity of the figure.)

As exhaust gas flow exits the fin array of the thermoelectric device, an expansion of cross-sectional area occurs into a second reactive chamber 103. The exhaust fluid flows into the second reactive chamber 103 before exiting through the outlet tube, which can have any suitable cross-sectional shape (e.g., circular, rectangular, polygonal, etc.), where the fluid experiences a contraction of cross-sectional area. The reactive chamber 103 may also attenuate low frequency sounds by reflecting the sound pulses off the back wall of the muffler. This reflection of the waves creates destructive interference. The exit tube may also protrude into the chamber (not shown in the figures), which may further provide a barrier for sound waves from exiting the system.

Figure 23B:
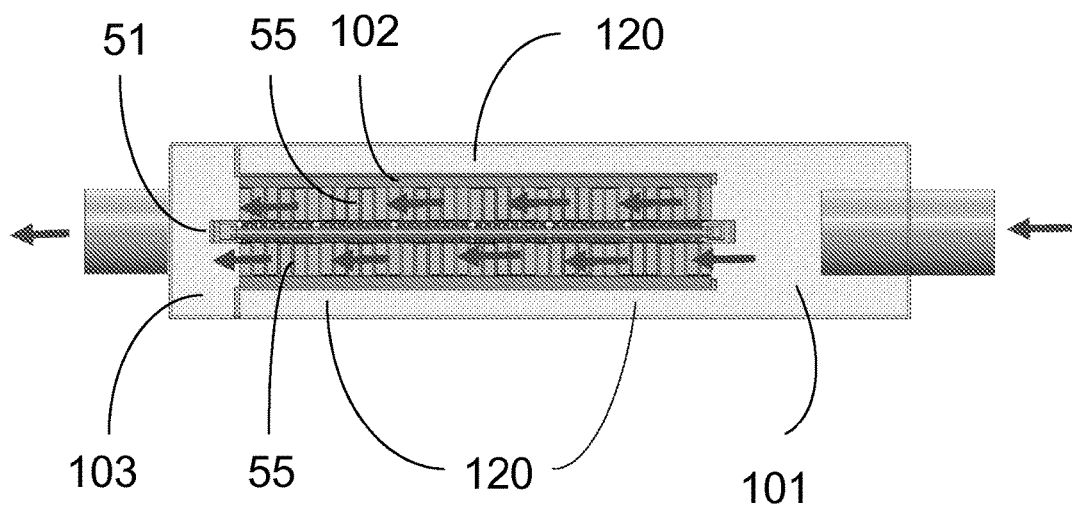
FIG. 23b illustrates a longitudinal/axial cross-sectional view of a thermoelectric muffler system with a top and bottom extended inlet reactive chamber in accordance with some embodiments.

Instead of, or in addition to, noise dampening components 102 being located between the thermoelectric device and the inner surface of the duct (e.g., along the flow-length of the device), as shown in FIGS. 22 and 23a, alternative noise dampening components may be used, for example, including one or more fluid passageways, chambers, walls, or perforated walls. FIG. 23b shows chambers within the interior space of the duct that form two extended reactive chambers 120 (upper and lower regions of the duct), extending from the expansion inlet chamber 101 toward the outlet chamber 103.

Figure 23C:
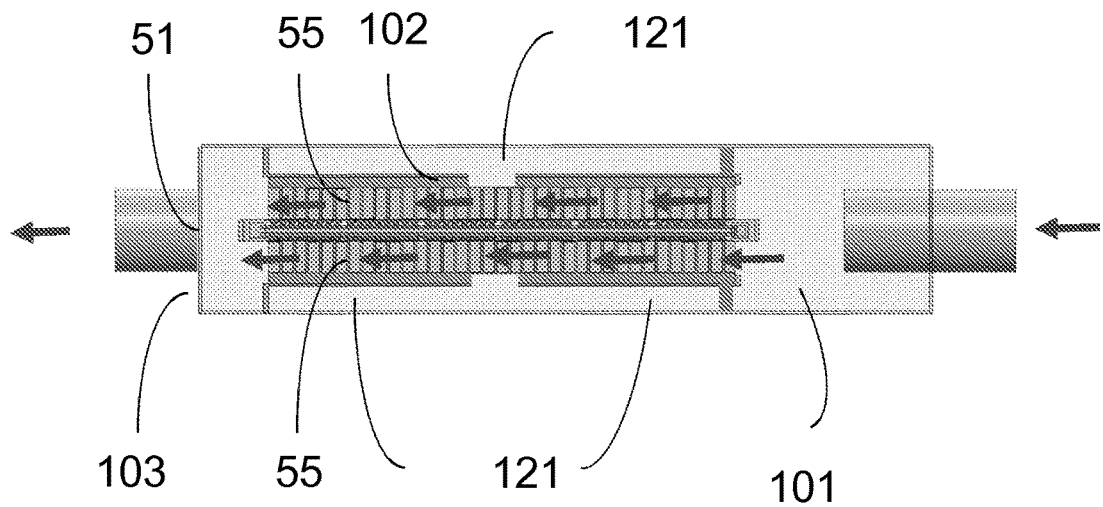
FIG. 23c illustrates a longitudinal/axial cross-sectional view of a thermoelectric muffler system with a mid-length reactive chamber in accordance with some embodiments.

Similarly, in another embodiment, an extended reactive chamber for the expansion outlet chamber 103 may be formed by simply opening the extended chamber to the outlet chamber 103 and walling off an opening to the inlet chamber 101. A variant embodiment is shown in FIG. 23c, which depicts two isolated reactive chambers 121 at upper and lower regions of the device, which are constructed to acoustically interact with sound waves having traveled amongst the fins at the mid-length.

Figure 23D:
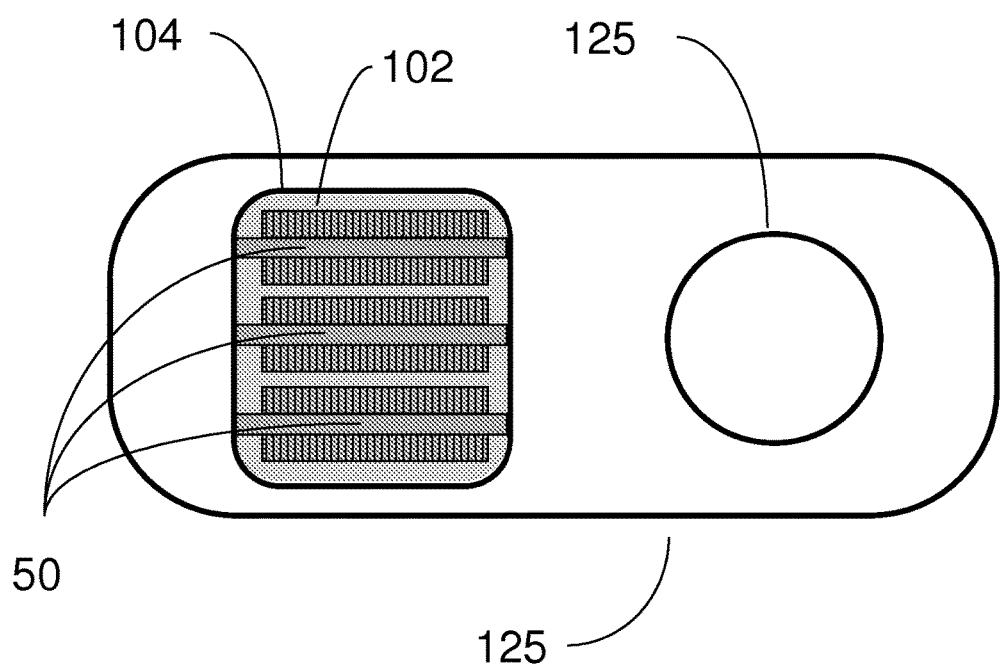
FIG. 23d illustrates a lateral cross-sectional view of a thermoelectric muffler system enclosing an outlet tube and plurality of devices within a duct in accordance with some embodiments.

For certain embodiments, as shown in FIG. 23d, the system may include further features, for example, where multiple thermoelectric devices are disposed within a duct 104. The multiple devices 50 (not necessarily cuboid) within the duct 104—or other thermoelectric devices 128 that may inserted within a duct space 104—may be disposed within a larger housing chamber 125, which may also route gas from the housing inlet, through the duct 104 with the thermoelectric devices 50 or 128, and to the housing chamber. The housing chamber may provide a gas exit tube 125, optionally perforated, which may optionally protrude substantially into the housing chamber and be oriented to be substantially parallel to the duct#, and extend over a substantial portion of the chamber distance.

Figure 25:
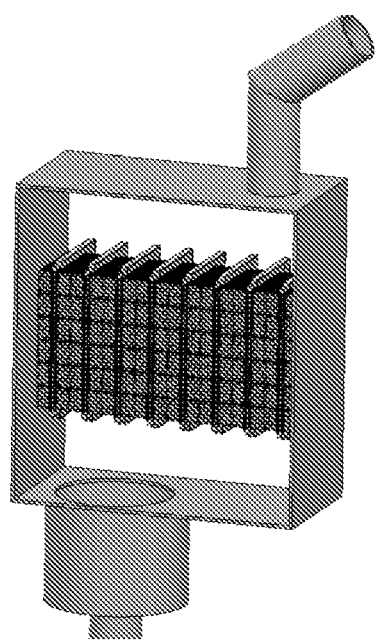
FIG. 25 depicts a perspective view of horizontally-stacked thermoelectric system in accordance with some embodiments.

In some embodiments, inlet and outlet volumes between the exhaust tubes and the thermoelectric device that are formed by the duct that contains the device may be extended to include a variety of muffler components. As muffler constructions and housings are often cuboid in shape, aspects of the thermoelectric muffler system described herein may be readily compatible therewith. Similar approaches may be used for after-treatment devices (e.g. catalytic converter, diesel particulate filter, etc.). As provided herein, systems and methods in accordance with the present disclosure may reduce flow transition pressure drop and/or total volume confined by the device and muffler (and/or after-treatment device) that would otherwise occur with separate components. As an example, FIG. 25 depicts a horizontal stack of 8 devices to deliver 4 kW of power within a duct which may also employ noise dampening components and features to serve as a thermoelectric muffler system. After-treatment device (e.g. catalyst) is located at the inlet which facilitates inlet flow transition to the duct while providing, overall, a very compact package.

The disclosed thermoelectric muffler system (with optional after-treatment inlet or outlet) has the potential to significantly reduce overall size, weight, backpressure, and cost of an exhaust system with heat recovery, as compared to systems where the thermoelectric device and muffler would otherwise be separate. By effectively combining a thermoelectric device and a muffler together, this approach reduces and/or may eliminate the need for a separate muffler.

Figure 23E:
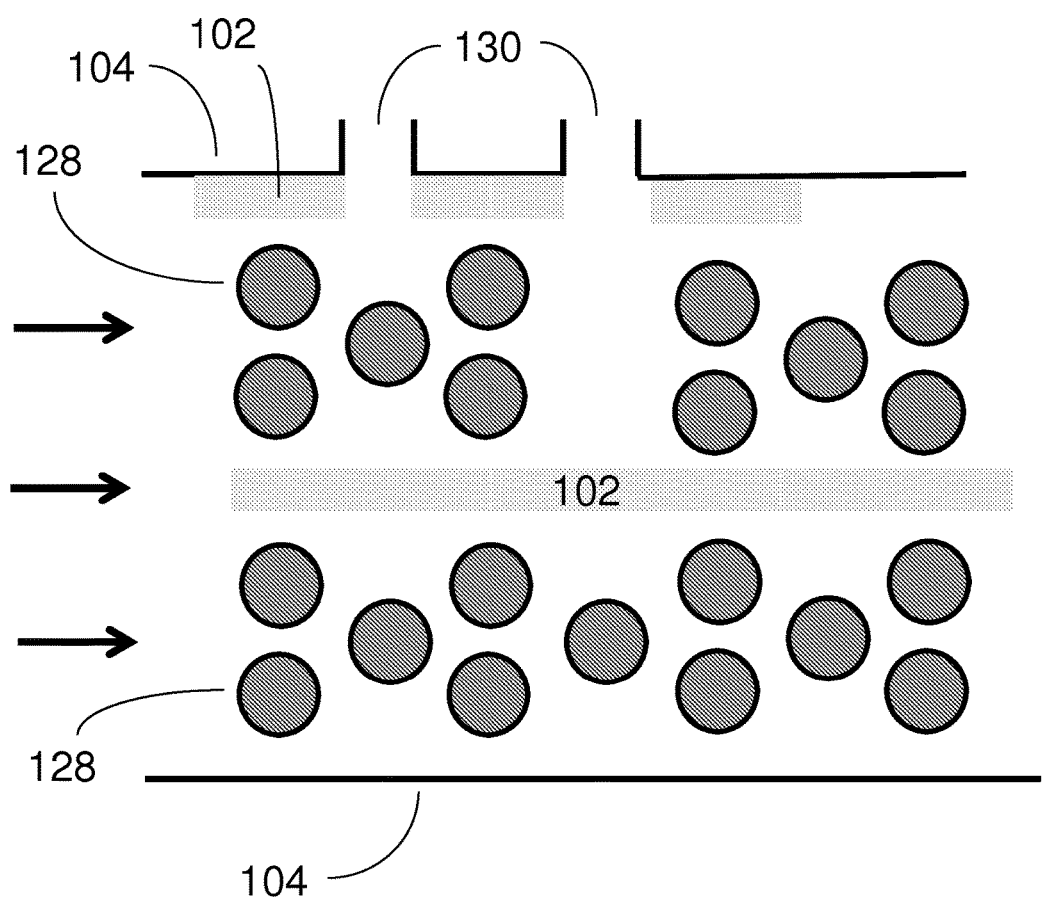
FIG. 23e illustrates a longitudinal/axial cross-sectional view of a thermoelectric muffler system with a plurality of general thermoelectric devices with noise dampening arrangements surrounding them within a flow space in accordance with some embodiments.

It can be appreciated that any suitable thermoelectric device(s) may be placed within an appropriate, optionally enclosed, flow space (e.g., exhaust tube, duct, muffler, etc.) and are not limited to specific embodiments of thermoelectric devices described herein. For example, the above description relating to a thermoelectric muffler incorporating various embodiments of the thermoelectric device within a duct may be applicable for any appropriate thermoelectric device (e.g. substantially cylindrical, cuboid, combination of both, among others) whereby a substantial portion, if not the entirety, of the thermoelectric device and any thermally conductive component(s) (e.g., fins or other geometries) extending therefrom is disposed within the flow space (e.g., in contact with surrounding fluid), while optionally remaining unattached to the duct. For example, a plurality of thermoelectric devices 128 (e.g. cylindrically-shaped is shown here) may be disposed in an arrangement, as shown in FIG. 23e, whereby noise dampening components 102 may be located between the thermoelectric device and the inner surface of the duct (e.g., along the flow-length of the device), Or, other types of thermoelectric devices may be placed within a fluid flow space, as appropriate.

Similarly, it should be understood that embodiments of thermoelectric devices of the present disclosure may be integrated or otherwise employed with any thermoelectric system. As noted above, embodiments of the thermoelectric device may be placed, for example, within the flow space of a duct or after-treatment device or muffler. Though, thermoelectric devices described herein may be incorporated in other types of relatively high temperature systems.

In conjunction with thermoelectric systems/devices presented herein, or for other applications that do not employ thermoelectrics, it may be beneficial to employ a conformable heat exchanger that conforms to, thermally communicates with, and slides along a structure (e.g., thermoelectric layer(s), internal heat exchanger(s)) that the heat exchanger surrounds or is otherwise adjacent. In various embodiments, this conformable heat exchanger may be simply a conformable surface, sheet, or wall, whose outer surface has been adapted to enhance heat transfer with the environment (e.g. via a plurality of fins extending from the enclosure). Fin type and design may be employed so as to not overly restrict the ability of the heat exchanger to substantially conform and perform as the particular application at hand requires. (More on fins for conformable sheets or enclosures are discussed in previous sections.) In some embodiments, in accordance with aspects described herein, the conformable heat exchanger is a conformable enclosure that surrounds one or more thermoelectric layers and/or additional heat exchangers.

While aspects of this conformable heat exchanger may include the base sheet of an enclosure or other features thereof, including noise dampening components in the vicinity of the heat exchanger, certain elements are not necessary for all embodiments of the present disclosure. In some cases, the structure having a shape to which the conformable heat exchanger conforms does not have to be thermoelectric layers but may include any suitable structure, including one that itself changes shape.

In addition, while the surface of the structure may be connected to an enclosure, such a connection is not required for various embodiments. Further, it is not required in every embodiment for sliding between components to be caused by thermal expansion of the conformable surface or any component(s) to which the surface is coupled.

The compressive pressure that causes the heat exchanger to conform and interface with an adjacent structure may be provided by a vacuum (e.g. depressurized from atmospheric pressure) on one or more sides or another method. For example, a portion of the surface may be mechanically pulled (e.g. creating tension), or a suitable pressure differential may be generated across the heat exchanger. A pressure differential may be achieved by methods other than via a vacuum, for example, the pressure of the surrounding environment may be increased to above atmospheric pressure, whether under the ocean or within a pressurized component, container/vessel, or machine, amongst others.

The conformable heat exchanger may also transfer heat intermittently or with variable thermal effectiveness to the adjacent structure due to varying of the compressive pressures or varying any interface substance—thermal, antifriction, or otherwise (i.e. graphite pad, fluid, grease, oil, etc.)—that may be between the two.

In conjunction with thermoelectric systems/devices presented herein, or for other applications that do not employ thermoelectrics, a solid-state thermal switch may reduce the ability of a structural member to conduct heat (e.g. reduce the effective thermal conductivity of the structural member) when its temperature rises above a given value. This ability for the thermal conductivity to be modulated may provide for applications with operational control, such as in order to protect components from overheating. One application where embodiments of a thermal switch may be incorporated is in a heat exchanger, wherein the effective thermal conductivity of the heat exchanger may be reduced in response to a rise in the temperature of the heat exchanger above a certain threshold or cutoff value.

Such a heat exchanger incorporating a thermal switch may be used to protect thermoelectric material(s) in relatively high-temperature applications where the thermoelectric material(s) are unable to operate above a threshold temperature without failing. Here, the heat exchanger transfers heat to the temperature-sensitive thermoelectric material(s), though, the heat exchanger may reduce its effective thermal conductivity near the interface with the thermoelectric material(s). Accordingly, the temperature of the thermoelectric material(s) may remain at temperatures below the threshold temperature, for their protection. While, in some cases, the effective thermal conductivity of the heat exchanger is reduced, the thermoelectrics may still be able to perform their function since the thermal switch incorporated into the heat exchanger may be configured to still transfer some heat to and from the thermoelectrics above the threshold temperature.

As noted above, many thermoelectric materials are not able to perform in a suitable manner at excessively high temperatures (e.g., anywhere between 500-650 degrees C. and up is typical) and may be protected by employing a very thin solid-state thermal switch technology, described herein, which can be integrated into any suitable heat exchanger, e.g., at its base.

A basic function of thermal switches in accordance with the present disclosure is to reduce thermal conductivity by causing a fluid to undergo a phase change—. The fluid may change state from a liquid to a gas (e.g. at a boiling or vaporization or evaporation temperature) corresponding to a desired threshold temperature. In a gaseous state, most fluids exhibit much lower thermal conductivities than in the liquid state.

When implemented in systems described herein, this fluid may be suitably contained in passages (e.g. channels, mini-channels, micro-channels, grooves, gaps, among other options) within a solid member, wherein changing the effective thermal conductivity of the fluid is desired. The construction and location of the passages may depend upon the application, yet are not limited to any particular structural configuration or application.

Figure 26:
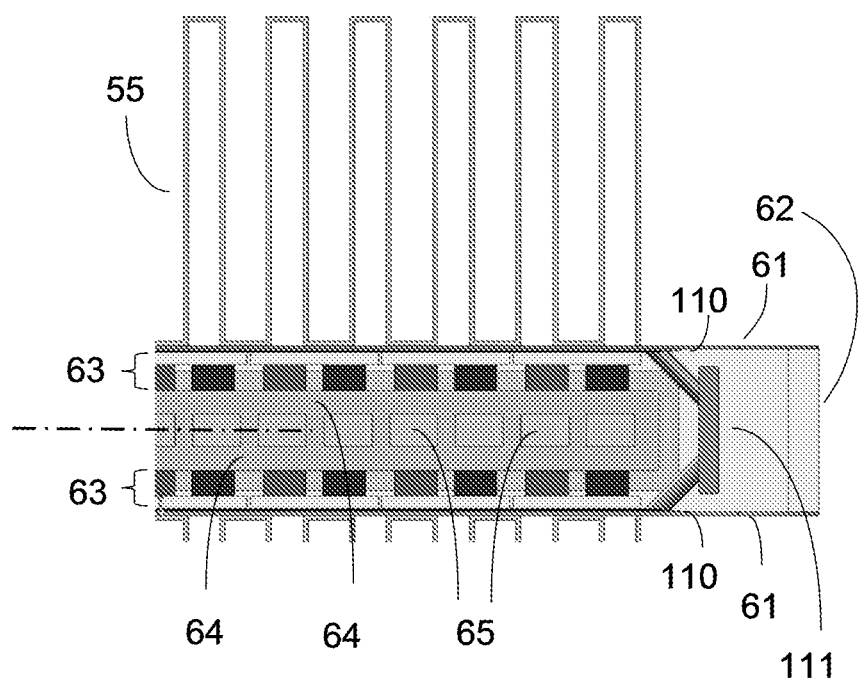
FIG. 26 shows a cross-sectional view of a thermoelectric device in accordance with some embodiments.

For applications involving hot-side heat exchangers for thermoelectrics, in a variety of embodiments, a thin thermal switch may be incorporated within an inner surface of the base sheet or plate 61 of the hot-side heat exchanger, as referenced in FIG. 26.

Figure 27:
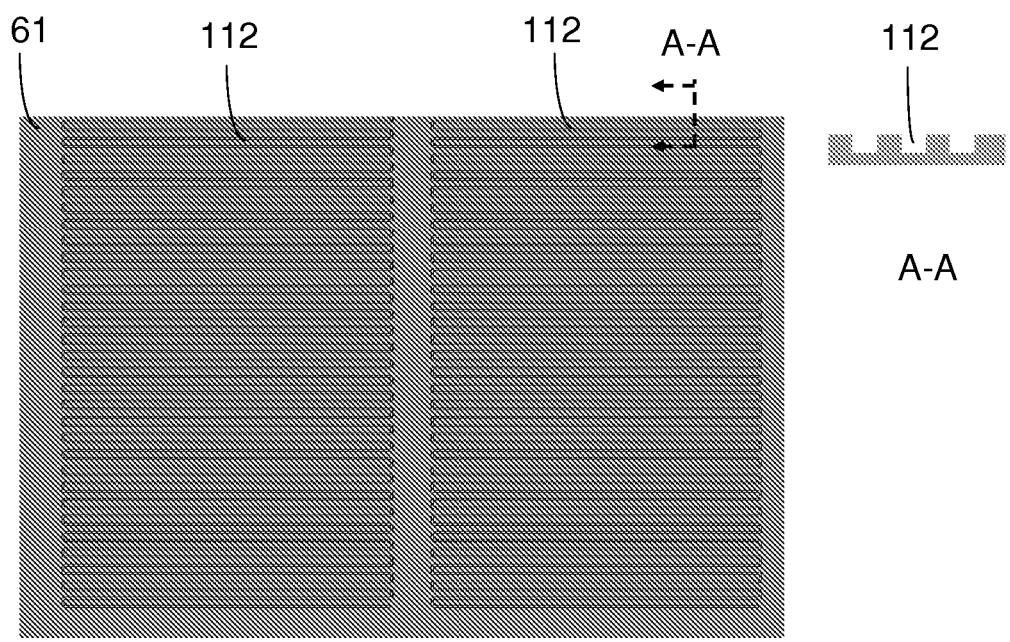
FIG. 27 illustrates channel grooves along a sheet, along with a close-up cross section of a thermal switch in accordance with some embodiments.

As shown in FIG. 27, small passages such as micro-channels 112 may be formed in the base sheet or plate 61, filled with an appropriate fluid or fluid composition, and enclosed by attaching a thin cover sheet 110 onto the channeled surface. Here, in this illustrative embodiment, micro-channels are etched in the base sheet 61.

Figures 28A, 28B:
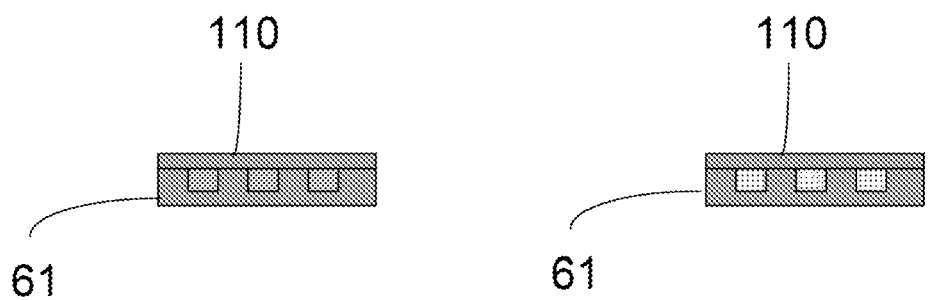
FIGS. 28a and 28b illustrates a close-up cross-section view of enclosed fluid channels of a thermal switch in accordance with some embodiments.

FIGS. 28*a* and 28*b* show partial cross sections of the enclosed fluid channels. Here, in this illustrative embodiment, a fluid composition is enclosed within micro-channels of a thermal switch and the fluid composition is shown to change state and conductivity. FIGS. 28*a* and 28*b* also show a conceptual comparison of the thermal switch before and after it changes state, corresponding to a higher conductivity in its liquid phase and a lower conductivity in its vapor phase, respectively.

In various embodiments, forming channels in the base sheet may be achieved through mechanically machining, chemical etching, or stamping, among others. For a metal heat exchanger, attaching the thin sheet to the surface may be achieved through a variety of methods including brazing, diffusion bonding, soldering, among others. While incorporating a thermal switch, the composite base and thin sheets may be configured such that the overall thickness is still thin enough to function as a conformable enclosure. Microchannels offer a very thin compact approach for employing the thermal switch and can be made to be very shallow, minimizing or otherwise reducing the path length of thermal conductance for transferring heat, which may be desirable.

Instead of forming microchannels, a variety of other embodiments may be employed. For example, a thermal switch may include a formed depression within the base or cover sheet of the enclosure in which a thin screen or scaffolding is placed therebetween so as to withstand interfacial pressure(s) (and/or partial vacuum within the fluid passages) while allowing the fluid to migrate or wick throughout the fluid volume.

In various embodiments, the fluid within the passages may be contained in a closed passage volume, whereby the passage pressure may be adjusted or tuned to change the boiling point temperature of the fluid (i.e. switch's threshold or cutoff temperature).

Although, in some cases, the fluid may reside entirely within the heat exchanger, in another embodiment, a tube (e.g. capillary tube) may be affixed to the passage so as to extend the passage and fluid outside the heat exchanger, for ease of access for filling with fluid (e.g., for replenishment or maintenance) and pressurizing or de-pressuring the passage.

Another embodiment may include a bulb 111, as shown in FIG. 26, that adds more volume to the fluid passages, which increases design versatility with this approach. Although FIG. 26 shows the bulb inside the enclosure, other embodiments may employ the bulb outside the enclosure. These appendages, in some embodiments, may be relatively rigid to withstand high, low, or vacuum pressures. Within the rigid bulb, other embodiments may include a compressible diaphragm filled with a different fluid (or similarly-functioning component), which reduces its volume in response to the expanding fluid as the fluid changes state.

In other embodiments, the bulb may be flexible to accommodate the expanding fluid as it transitions from liquid to gas. Furthermore, a flexible bulb is able to equilibrate its passage pressure within to the pressure outside; consequently, for a bulb within a vacuum enclosure for the thermoelectric device, the level of vacuum pressure within the enclosure may be appropriately tuned to adjust the thermal switch passage pressure and, in turn, the cutoff temperature of the switch.

In certain embodiments, a plurality of separate thermal switches with or without bulbs (or tube extensions) may be disposed within a heat exchanger or sheet. In various embodiments, one switch may be positioned at or near the inlet region of the heat exchanger and additional switches may be located along other regions of the heat exchanger. The switch(es) may suitably respond as hot gas temperature flows through the device, or fluid heat exchanger, from one end (inlet), losing heat and reducing temperature, to the other (outlet). In this case, thermal switches may be used to close the inlet, by activating before those switches that are located downstream. Also, some thermal switches within the plurality may be adjusted to activate at different threshold temperatures than others, corresponding to different thermoelectric materials and their different temperature sensitivities.

A variety of fluids may be used for the thermal switch, including sodium- and potassium and its alloys such as NaK, among others. These substances have substantially high liquid thermal conductivities and boiling points in the 500-650 degrees C. range for vacuum pressures—the temperature range appropriate for protecting themoelectrics for engine exhaust applications. In other embodiments, fluid mixtures with more than one type of fluid may be used to adjust thermal switch performance. Fluids may also be pure, binary, tertiary, among other fluid compositions.

For an engine exhaust thermoelectric device, thermal switches described herein deems unnecessary a bulky exhaust gas bypass passageway activated by an on/off damper, which has been the proposed solution in the industry for conventional thermoelectric systems to protect the thermoelectric materials. The inherent compactness of the thermoelectric device, the thermal switch (which eliminates a separate bypass), and muffler dampening material integration (which may eliminate a separate muffler) makes this device technology and its associated systems attractive for vehicle applications.

In conjunction with thermoelectric systems/devices presented herein, or for other applications that do not employ thermoelectrics, a thermal interface composite is disclosed. The thermal interface composite includes two or more substances that may improve the thermal interface contact (e.g. effective thermal conductivity) between two sliding surfaces than with only one substance or none at all. One application which may have such sliding surfaces, and where the thermal interface composite may be incorporated, is within an embodiment of a thermoelectric device.

The conventional approach to reduce the thermal contact resistance between sliding surfaces of components is to introduce a thermal interface material 84 in between the surfaces such as conformable graphite foil or pad, copper foil, other metal foils, carbon nanotube pad, thermal grease, amongst others. Solid thermal interface materials may at least partially conform and help bridge gaps that exist between the sliding surfaces and typically have better thermal conductivities within the solid than a thermal liquid or grease; however, solid thermal interface materials introduce two sides of interface contact, which can inherently introduce more thermal contact resistance and may significantly diminish the benefit of the thermal interface foil. Although a liquid or grease interface substance typically provides for more desirable contact to surfaces (e.g. lower thermal contact resistance), if applied alone to an interface that has significant gaps, the lower thermal conductivity of the liquid or grease may not result in better thermal performance than a solid foil.

Approaches in accordance with the present disclosure for the thermal interface composite use a combination of a conformable solid material with a liquid or grease on either or both sides of the foil to reduce the overall thermal interface resistance between the two sliding surfaces—in other words, resulting in a greater effective thermal conductivity across the interface of the two surfaces than with just one of the substances (e.g. the foil or grease). Conformable, in this particular instance, is in reference to the material having greater elastic properties than the solid components that make up the interface (i.e., located on either side of the material), and sandwich the conformable sheet. The conformable material or foil may bridge the larger gaps between the two sliding surfaces which may be on the order of mini- to micro-scale, while the liquid adheres to surfaces and may bridge gaps on the order of micro- to nano-scale. The second component does not have to remain liquid at all times, however. A substance that changes phase from solid to liquid by the time the device reaches a desired operating condition would also be sufficient, such as a film of tin or solder.

This thermal interface composite approach also reduces the possibility of 'pump out' of the liquid during thermal cycling, which results in the liquid migrating out of the interface leaving air gaps, due to cyclic thermal deformations of interface surfaces during thermal cycling.

One embodiment may include a conformable graphite foil with a thin layer of grease on both sides of the foil. Experiments were conducted comparing this embodiment to a single graphite foil, and results have showed that overall thermal contact resistance can be reduced to up to 40-50 percent at low contact pressures of 15 psi, as compared to systems where foil was used without the grease (i.e., interfacial composition). For higher contact pressures the percent reduction in thermal contact resistance diminishes.

Although some reference to the materials, construction, and fabrication of a variety of embodiments were mentioned in the previous sections, particular attention and detail is provided here describing the manufacture of the conformable vacuum enclosure and its assembly with the remaining thermoelectric device as related to the low-profile rectangular cuboid-like shape. For this approach, while many designs for manufacture and assembly processes exist and may be suitably employed, only a number of representative examples are presented herein.

A wide variety of enclosure materials may be employed including metals and certain plastics (depending upon hot fluid temperature in application), amongst others. However, corrosive-resistant metals may be preferred in order to withstand high-temperature corrosive and oxidizing engine exhaust flows for long periods of time (e.g., many years).

In some embodiments, the enclosure sheet and/or fin materials may include stainless steel, nickel-based alloys (e.g., inconel), molybdenum, and titanium, amongst others. Enclosure sheet and fins may be thin enough to provide a desirable degree of elastic conformability under vacuum, while also providing considerable corrosion-resistance to combustion exhaust gas and strength, which may be particularly useful for the base sheet.

Joining methods between the fins and enclosure may include brazing, welding, and diffusion bonding, amongst others.

As shown earlier, FIG. 10 shows a conceptual example of the conformability described above, to thermoelectric layer surfaces. Furthermore, experiments have been conducted which verify conformability of such a semi-elastic structure, including a prototype of a thermoelectric device, similar to the shape in FIG. 19.

Figure 19:
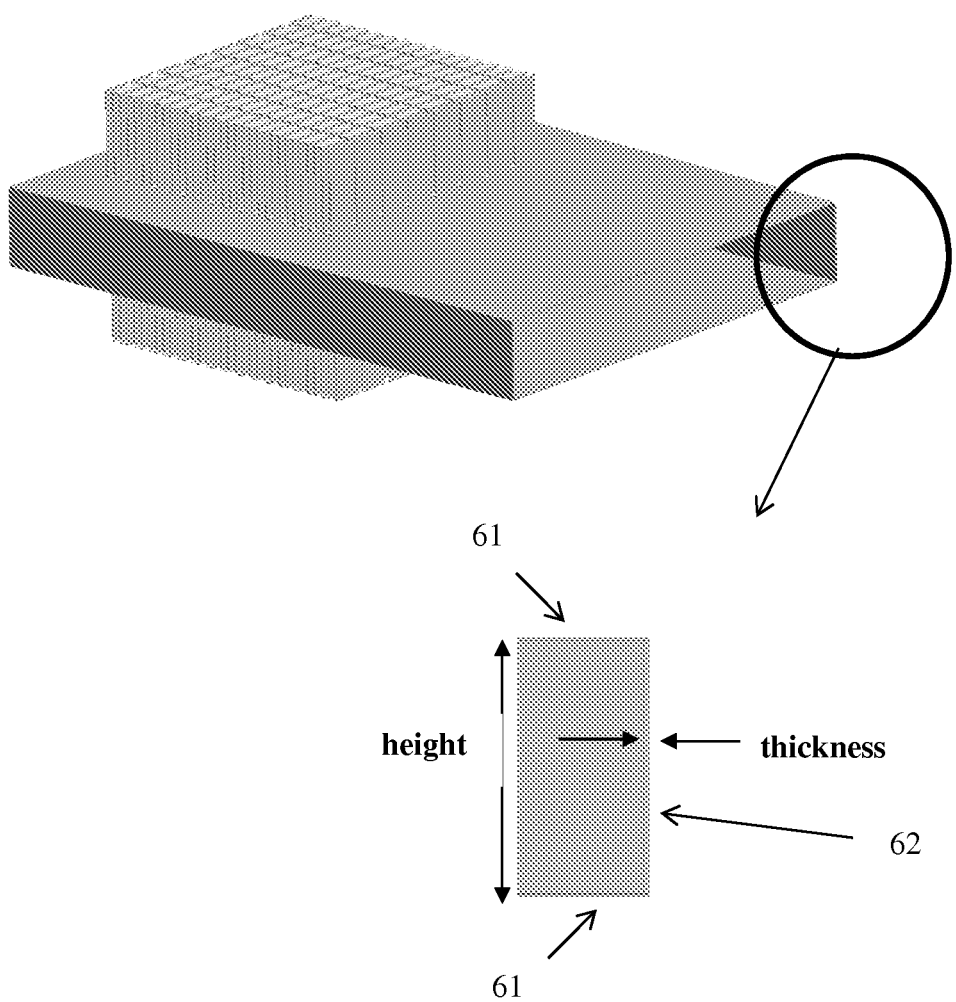
FIG. 19 depicts a view of a cuboid-shaped enclosure in accordance with some embodiments, along with a close-up cross-sectional view of a sidewall.

To fabricate the enclosure shape, one embodiment may include welding of a cuboid-shaped box together, into which inside components are inserted. In an example, a similar box design enclosure design, as shown in FIG. 19, was fabricated for a thermoelectric prototype, including the conformable base sheet 61 welded to the side wall 62 or frame. After this box enclosure was made, internal components (e.g., heat exchanger, thermoelectric materials, etc.) were inserted into the open end of the box, which was subsequently walled and sealed in a similar manner. This prototype design and construction was successfully shown to be airtight with a high vacuum provided therein. Furthermore, this thermoelectric prototype performed as intended including the conformable enclosure functioning properly as disclosed herein—for gas flow air temperatures up to 600 degrees C. (which was the limit the test stand) and likely higher temperatures. This prototype has a footprint smaller than that for a passenger car but similar height dimensions.

Figure 20:
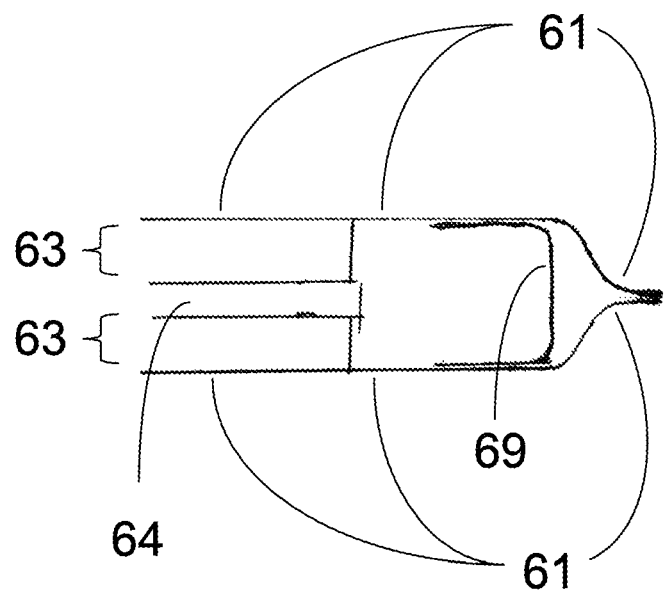
FIG. 20 shows close-up cross-sectional views of various cuboid-shaped enclosures in accordance with some embodiments.
Figure 20:
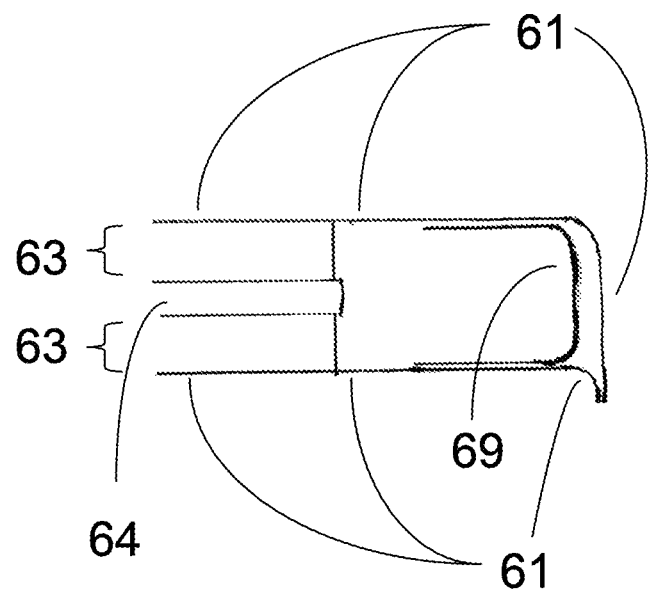

The low-height cuboid shape of embodiments described allows other manufacturing approaches that are much easier, however. A variety of embodiments may include two large sheets or halves which are drawn or stamped to form the relatively shallow height/depth within the base sheets 61 (without a separate side wall 62), similar to a clam-shell configuration, as shown in FIG. 20 as cross-section views, which shows two possible formed options. The base sheets 61 for upper and lower regions of the enclosure may be drawn together at their periphery so that they meet to form a joinable interface between the two base sheets or halves, which may eliminate any need for inclusion of a separate side wall of the enclosure.

The internals—e.g., coolant heat exchanger 64, thermoelectric layers 63, structural supports 69, and other components (not explicitly shown) reside within the space enclosed by the two halves.

Possible joining approaches may include welding, brazing, soldering, amongst others. Mechanical coupling by methods of other fastening, bolting, clamping, capping, amongst others may be employed along with a gasket or other methods of sealing.

The clam-shell approach may be advantageous in that this configuration does not involve as many parts as in other configurations (e.g., only upper and lower halves may be employed). In the clam-shell approach, the seam between joined parts is not long, thus, the risk of joint failure is reduced. Further, the vacuum within the enclosure may be drawn after the enclosure is sealed.

Having thus described several aspects of various embodiments of the present disclosure, it is to be appreciated various alterations, modifications, and improvements will readily occur to those skilled in the art. Such alterations, modification, and improvements are intended to be part of this disclosure, and are intended to be within the spirit and scope of the invention. Accordingly, the foregoing description and drawings are by way of example only.

What is claimed is:

1. A thermoelectric system, comprising:
   a duct defining a flow space having an inlet and an outlet, wherein heated fluid is confined within the duct and flows from the inlet to the outlet; and
   a thermoelectric device, disposed in the flow space, the thermoelectric device comprising:
   at least one coolant heat exchanger, having a first side and an opposite second side, and comprising at least one coolant heat exchanger section, through which a coolant fluid flows;
   a first thermoelectric layer in thermal communication with the first side of the at least one coolant heat exchanger;
   a second thermoelectric layer in thermal communication with the second side of the at least one coolant heat exchanger;
   an enclosure surrounding the first and second thermoelectric layers and the at least one coolant heat exchanger, the enclosure providing a sealed barrier for the first and second thermoelectric layers and the at least one coolant heat exchanger from the heated fluid located outside of the enclosure, wherein a portion of the enclosure is adapted to conduct heat and is in thermal communication with the first and second thermoelectric layers, and wherein the at least one coolant heat exchanger is movable relative to an inner surface of the enclosure, in order to accommodate for thermal expansion of the at least one coolant heat exchanger and the enclosure.

2. The thermoelectric system of claim 1, wherein the enclosure comprises top and bottom base sheets in thermal communication with the first and second thermoelectric layers, respectively, and wherein portions of the top and bottom base sheets conform elastically to the first and second thermoelectric layers to achieve thermal contact and dynamically compensate for thermal expansion.

3. The thermoelectric system of claim 2, further comprising a plurality of fins extending from an outer surface of the portions of the enclosure that conform elastically to the first and second thermoelectric layers, the plurality of fins spaced apart so that individual fins may move relative to one another and allow the top and bottom base sheets to conform elastically.

4. The thermoelectric system of claim 2, wherein the enclosure comprises a clam-shell arrangement wherein the top and bottom base sheets are engageable and attached to one another and disposed opposite and substantially parallel to one another.

5. The thermoelectric system of claim 1, wherein the enclosure comprises top and bottom base sheets in thermal communication with the first and second thermoelectric layers, respectively, and sidewalls spanning the distance between the top and bottom base sheets.

6. The thermoelectric system of claim 5, wherein the sidewalls are compliant to compensate dynamically for thermal expansion.

7. The thermoelectric system of claim 6, wherein the sidewalls are substantially semi-circular in shape.

8. The thermoelectric system of claim 1, comprising a compliant thermal interface material disposed between the enclosure and the first and second thermoelectric layers or between the at least one coolant heat exchanger and the first and second thermoelectric layers to compensate dynamically for thermal expansion.

9. The thermoelectric system of claim 1, wherein pressure within the enclosure is maintained at a pressure less than that outside the enclosure.

10. The thermoelectric system of claim 1, further comprising a plurality of fins extending from an outer surface of the enclosure to enhance heat transfer to the enclosure.

11. The thermoelectric system of claim 10, further comprising at least one reinforcement member in communication with the plurality of fins to add structural reinforcement.

12. The thermoelectric system of claim 1, wherein at least a portion of the thermoelectric device is adapted to treat emissions of the heated fluid and function as a catalyst.

13. The thermoelectric system of claim 1, comprising an inlet for the coolant fluid to flow to the coolant heat exchanger, and an outlet for the coolant fluid to flow from the coolant heat exchanger, wherein the inlet and outlet pass through the enclosure in near proximity to one another to achieve limited thermal expansion therebetween.

14. The thermoelectric system of claim 1, further comprising at least one noise dampening component.

15. The thermoelectric system of claim 14, further comprising a plurality of fins disposed on an outer surface of the enclosure of the thermoelectric device to enhance heat transfer to the enclosure and to dampen sound waves travelling in the flow space.

16. The thermoelectric system of claim 14, wherein the at least one noise dampening component is disposed within the flow space between a portion of the thermoelectric device and an inside surface of the duct.

17. The thermoelectric system of claim 14, further comprising a second thermoelectric device disposed in the flow space, where the thermoelectric device and the second thermoelectric device are configured in series or parallel arrangement and wherein the at least one noise dampening component is disposed between the thermoelectric device and the second thermoelectric device.

18. The thermoelectric system of claim 1, wherein the duct comprises an expansion chamber, a reactive chamber, and a middle portion disposed between the expansion chamber and the reactive chamber, where the thermoelectric device is disposed in the middle portion, and wherein the heat fluid flows through the inlet into the expansion chamber, the expansion chamber having a cross section greater than that of the inlet, and passes over the thermoelectric device and enters the reactive chamber, prior to exiting through the outlet, the outlet having a smaller cross section than the reactive chamber.

19. The thermoelectric system of claim 1, wherein a muffler component or an after-treatment component is disposed in an inlet volume of the flow space into which fluid enters or an outlet volume of the flow space from which fluid exits.

* * * * *